(12) United States Patent
Chun et al.

(10) Patent No.: US 10,580,726 B2
(45) Date of Patent: Mar. 3, 2020

(54) SEMICONDUCTOR DEVICES AND SEMICONDUCTOR PACKAGES INCLUDING THE SAME, AND METHODS OF MANUFACTURING THE SEMICONDUCTOR DEVICES

(71) Applicant: SAMSUNG ELECTRONICS CO., LTD., Suwon-si, Gyeonggi-do (KR)

(72) Inventors: Jin-Ho Chun, Seoul (KR); Seong-Min Son, Hwaseong-si (KR); Hyung-Jun Jeon, Seoul (KR); Kwang-Jin Moon, Hwaseong-si (KR); Jin-Ho An, Seoul (KR); Ho-Jin Lee, Seoul (KR); Atsushi Fujisaki, Seongnam-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/106,645

(22) Filed: Aug. 21, 2018

(65) Prior Publication Data
US 2019/0131228 A1    May 2, 2019

(30) Foreign Application Priority Data

Nov. 2, 2017    (KR) .......................... 10-2017-0145253

(51) Int. Cl.
*H01L 23/498*    (2006.01)
*H01L 23/525*    (2006.01)
(Continued)

(52) U.S. Cl.
CPC .. *H01L 23/49827* (2013.01); *H01L 21/76852* (2013.01); *H01L 21/76885* (2013.01); *H01L 21/76898* (2013.01); *H01L 23/3114* (2013.01); *H01L 23/481* (2013.01); *H01L 23/525* (2013.01); *H01L 23/5328* (2013.01);
(Continued)

(58) Field of Classification Search
CPC ......... H01L 21/76805; H01L 24/04–06; H01L 2224/023; H01L 2224/02351; H01L 2224/02381; H01L 23/4824; H01L 23/488; H01L 23/48
See application file for complete search history.

(56) References Cited

U.S. PATENT DOCUMENTS

| 6,455,408 B1* | 9/2002 | Hwang | ............... | H01L 23/3114 257/E21.508 |
| 6,621,164 B2* | 9/2003 | Hwang | ............... | H01L 23/3114 257/738 |

(Continued)

FOREIGN PATENT DOCUMENTS

KR    10-1121827 B1    2/2012

*Primary Examiner* — David A Zarneke
(74) *Attorney, Agent, or Firm* — Lee IP Law, PC

(57) ABSTRACT

A semiconductor device and a method of manufacturing the same, the device including a through-hole electrode structure extending through a substrate; a redistribution layer on the through-hole electrode structure; and a conductive pad, the conductive pad including a penetrating portion extending through the redistribution layer; and a protrusion portion on the penetrating portion, the protrusion portion protruding from an upper surface of the redistribution layer, wherein a central region of an upper surface of the protrusion portion is flat and not closer to the substrate than an edge region of the upper surface of the protrusion portion.

20 Claims, 36 Drawing Sheets

(51) Int. Cl.
  *H01L 23/532* (2006.01)
  *H01L 23/31* (2006.01)
  *H01L 23/00* (2006.01)
  *H01L 21/768* (2006.01)
  *H01L 23/48* (2006.01)

(52) U.S. Cl.
  CPC ............ *H01L 24/11* (2013.01); *H01L 24/13* (2013.01); *H01L 24/48* (2013.01); *H01L 21/76805* (2013.01); *H01L 2224/11001* (2013.01); *H01L 2224/13101* (2013.01); *H01L 2224/13139* (2013.01); *H01L 2224/13147* (2013.01); *H01L 2224/16145* (2013.01); *H01L 2224/16225* (2013.01); *H01L 2224/73204* (2013.01); *H01L 2224/8385* (2013.01); *H01L 2924/1431* (2013.01); *H01L 2924/1436* (2013.01); *H01L 2924/15192* (2013.01); *H01L 2924/15311* (2013.01)

(56) References Cited

U.S. PATENT DOCUMENTS

| | | | |
|---|---|---|---|
| 7,067,929 B2 * | 6/2006 | Hanaoka | H01L 23/3114 257/737 |
| 7,183,645 B2 * | 2/2007 | Kurosawa | H01L 23/3114 257/737 |
| 7,312,143 B2 | 12/2007 | Park et al. | |
| 7,446,036 B1 * | 11/2008 | Bolom | H01L 21/76805 257/E21.585 |
| 7,550,844 B2 * | 6/2009 | Matsuki | H01L 23/3128 257/737 |
| 7,846,834 B2 * | 12/2010 | Yang | H01L 21/76805 438/620 |
| 7,964,966 B2 * | 6/2011 | Yang | H01L 21/76805 257/751 |
| 8,242,012 B2 | 8/2012 | Daubenspeck et al. | |
| 8,413,324 B2 * | 4/2013 | Noda | H05K 3/0032 29/825 |
| 8,735,276 B2 | 5/2014 | Chung et al. | |
| 8,755,196 B2 * | 6/2014 | Ouchi | H01L 23/49816 174/264 |
| 8,952,538 B2 | 2/2015 | Matsuki | |
| 9,142,522 B2 | 9/2015 | Bao et al. | |
| 9,202,743 B2 * | 12/2015 | Bao | H01L 23/53276 |
| 9,293,403 B2 | 3/2016 | Park et al. | |
| 9,793,243 B2 * | 10/2017 | Lu | H01L 21/76877 |
| 10,032,712 B2 | 7/2018 | Chen | H01L 23/5226 |
| 10,083,924 B2 * | 9/2018 | Maekawa | H01L 21/768 |
| 2008/0230877 A1 | 9/2008 | Chung et al. | |
| 2012/0061814 A1 * | 3/2012 | Camacho | H01L 21/4853 257/676 |
| 2017/0084591 A1 | 3/2017 | Magnus | |
| 2019/0123007 A1 * | 4/2019 | Zhao | H01L 24/13 |

\* cited by examiner

SEMICONDUCTOR DEVICES AND SEMICONDUCTOR PACKAGES INCLUDING THE SAME, AND METHODS OF MANUFACTURING THE SEMICONDUCTOR DEVICES

CROSS-REFERENCE TO RELATED APPLICATION

Korean Patent Application No. 10-2017-0145253, filed on Nov. 2, 2017, in the Korean Intellectual Property Office, and entitled: "Semiconductor Devices and Semiconductor Packages Including the Same, and Methods of Manufacturing the Semiconductor Devices," is incorporated by reference herein in its entirety.

BACKGROUND

1. Field

Embodiments relate to a semiconductor device, a semiconductor package including the same, and a method of manufacturing the semiconductor device.

2. Description of the Related Art

A conductive pad may be formed on a redistribution layer on one semiconductor chip, and may be electrically connected to another semiconductor chip through a conductive bump so that a semiconductor package may be manufactured.

SUMMARY

The embodiments may be realized by providing a semiconductor device including a through-hole electrode structure extending through a substrate; a redistribution layer on the through-hole electrode structure; and a conductive pad, the conductive pad including a penetrating portion extending through the redistribution layer; and a protrusion portion on the penetrating portion, the protrusion portion protruding from an upper surface of the redistribution layer, wherein a central region of an upper surface of the protrusion portion is flat and not closer to the substrate than an edge region of the upper surface of the protrusion portion.

The embodiments may be realized by providing a semiconductor device including a through-hole electrode structure extending through a substrate; redistribution layers on the through-hole electrode structure; and conductive pads, each of the conductive pads including a penetrating portion extending through one of the redistribution layers; and a protrusion portion on the penetrating portion, the protrusion portion protruding from an upper surface of the one of the redistribution layers, wherein at least two of the redistribution layers have different thicknesses from each other, and wherein upper surfaces of the redistribution layers have the same height from the substrate.

The embodiments may be realized by providing a semiconductor device including a first semiconductor chip, the first semiconductor chip including a through-hole electrode structure extending through a substrate, a redistribution layer on the through-hole electrode structure, and a first conductive pad, the first conductive pad including a penetrating portion extending through the redistribution layer; and a protrusion portion on the penetrating portion, the protrusion portion protruding from an upper surface of the redistribution layer, and a central region of an upper surface of the protrusion portion being flat and not closer to the substrate than an edge region of the upper surface of the protrusion portion; and a second semiconductor chip on one side of the first semiconductor chip, the second semiconductor chip being electrically connected to the first semiconductor chip through the first conductive pad.

The embodiments may be realized by providing a method of manufacturing a semiconductor device, the method including forming a through-hole electrode structure through a substrate; forming a redistribution layer on the through-hole electrode structure such that the redistribution layer includes a first opening; and forming a protection layer to cover the redistribution layer such that the protection layer includes a second opening connected to the first opening; and forming a conductive pad to fill the first opening and at least a portion of the second opening, wherein a central region of an upper surface of the conductive pad is flat and not closer to the substrate than an edge region of the upper surface of the conductive pad.

The embodiments may be realized by providing a method of manufacturing a semiconductor device, the method including forming a through-hole electrode structure through a substrate; forming redistribution layers on the through-hole electrode structure such that each of the redistribution layers includes a first opening; forming a protection layer to cover the redistribution layers such that the protection layer includes second openings connected to the first openings; and forming conductive pads, each of which fills the first opening and at least a portion of the second opening, such that a central region of an upper surface of each of the conductive pads is flat, wherein at least two of the redistribution layers have different thicknesses from each other, and wherein upper surfaces of the conductive pads have the same height from the substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
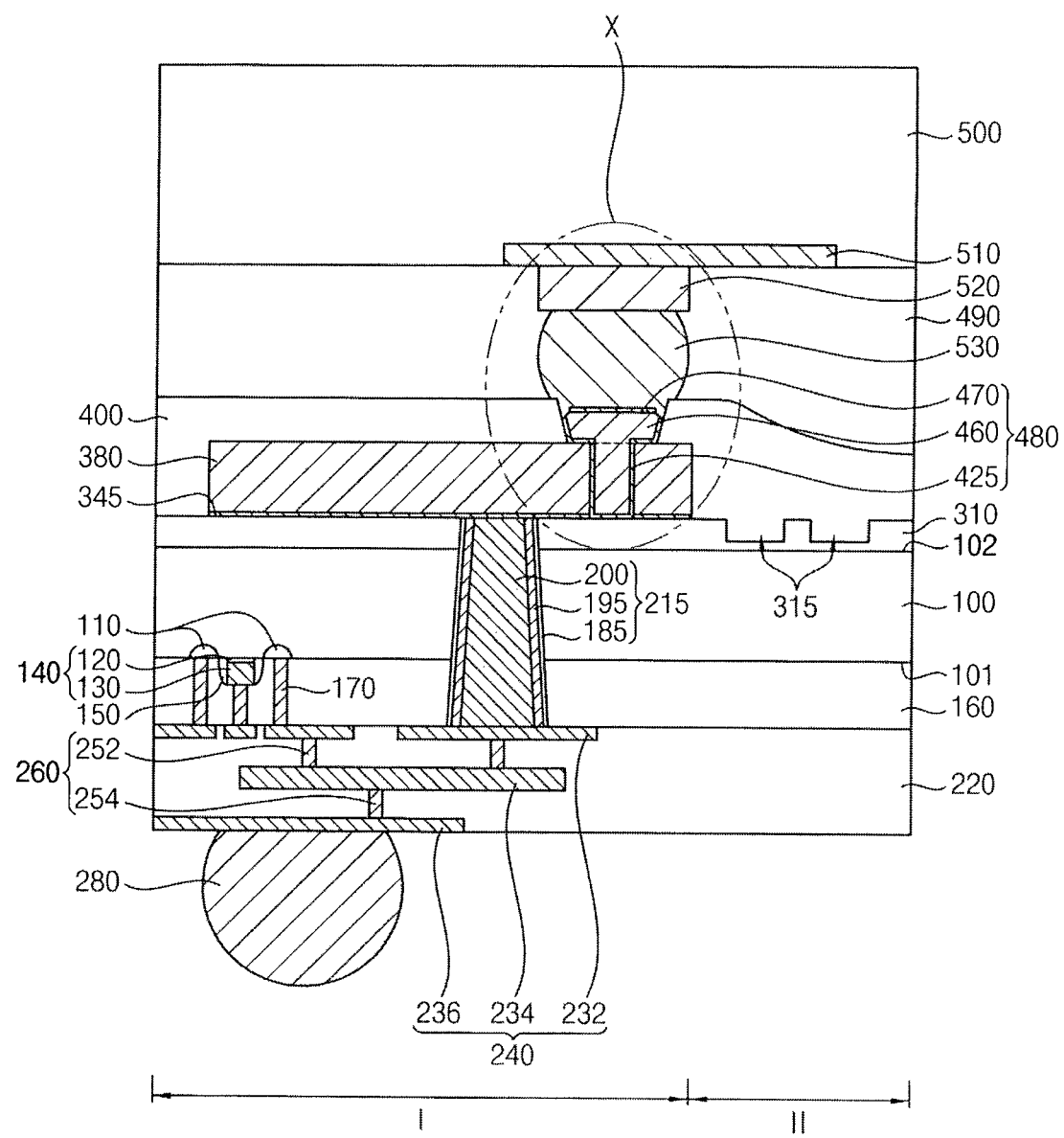
FIG. 1A illustrates a cross-sectional view of a semiconductor device in accordance with example embodiments.
Figure 1B:
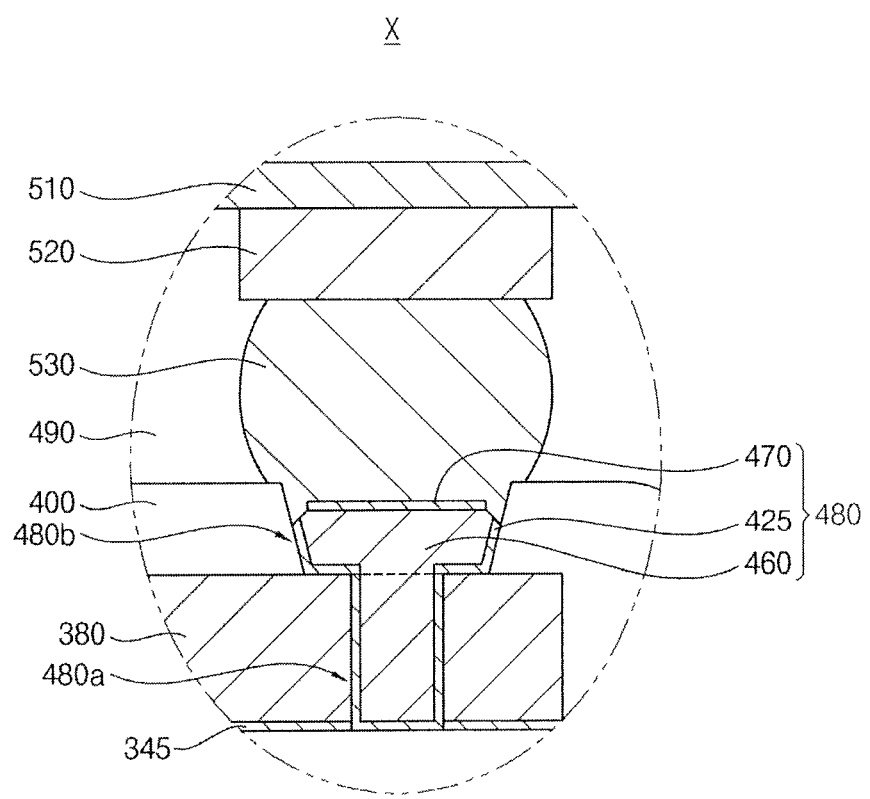
FIG. 1B illustrates an enlarged cross-sectional view of a region X of FIG. 1A.

FIG. 1A illustrates a cross-sectional view of a semiconductor device in accordance with example embodiments, and FIG. 1B illustrates an enlarged cross-sectional view of a region X of FIG. 1A.

Referring to FIGS. 1A and 1B, the semiconductor device may include a first semiconductor chip and a second semiconductor chip 500 sequentially stacked and bonded with each other, which may be electrically connected to each other by a first conductive pad 480, a second conductive pad 520, and a second conductive bump 530. In an implementation, the first semiconductor chip may include a logic chip, and the second semiconductor chip 500 may include a memory chip, e.g., a DRAM chip.

The first semiconductor chip may include a substrate 100, a first through-hole electrode structure 215 extending through the substrate 100, a first redistribution layer on the first through-hole electrode structure 215, and the first conductive pad 480 including a penetrating portion 480a extending through the first redistribution layer and a protrusion portion 480b on the penetrating portion 480a and protruding from an upper surface of the first redistribution layer (e.g., a surface that is distal to the substrate 100).

The first semiconductor chip may further include first and second insulating interlayers 160 and 220, circuit elements, a contact plug 170, wirings 240, vias 260, a passivation layer 310, a first protection layer 400, and a first conductive bump 280.

The substrate 100 may include silicon, germanium, silicon-germanium, or III-V compounds, e.g., GaP, GaAs, GaSb, etc. In an implementation, the substrate 100 may be, e.g., a silicon-on-insulator (SOI) substrate or a germanium-on-insulator (GOI) substrate.

The substrate 100 may have a first surface 101 and a second surface 102 opposite thereto, and may include first and second regions I and II. The first and second regions I and II may serve as chip and scribe lane regions, respectively. Hereinafter, not only the first and second regions I and II of the substrate 100 but also spaces extended from the first and second regions I and II of the substrate 100 upwardly or downwardly may be defined altogether as the first and second regions I and II, respectively.

In the first region I, circuit elements, e.g., a transistor, may be formed on the first surface 101 of the substrate 100. The transistor may include a gate structure 140 having a gate insulation pattern 120 and a gate electrode 130 sequentially stacked, and an impurity region 110 at a portion of the substrate 100 adjacent to the gate structure 140 and adjacent to the first surface 101 of the substrate 100. A gate spacer 150 may be further formed on a sidewall of the gate structure 140.

The gate insulation pattern 120 may include an oxide, e.g., silicon oxide or a metal oxide, the gate electrode 130 may include, e.g., doped polysilicon, a metal, a metal nitride and/or a metal silicide, etc., and the gate spacer 150 may include a nitride, e.g., silicon nitride.

A plurality of transistors may be formed in the first region I. In an implementation, the circuit elements may include, e.g., diodes, resistors, inductors, capacitors, etc.

The first and second insulating interlayers 160 and 220 may be sequentially stacked beneath the first surface 101 of the substrate 100 (e.g., in a direction away from the second semiconductor chip 500).

The first insulating interlayer 160 may cover the circuit elements, and may contain or surround the contact plug 170 extending through the first insulating interlayer 160 to contact the impurity region 110. In an implementation, the contact plug 170 may contact the gate structure 140. The first insulating interlayer 160 may include an oxide, e.g., silicon oxide, and the contact plug 170 may include, e.g., a metal, a metal nitride, a metal silicide, doped polysilicon, etc.

The second insulating interlayer 220 may contain or surround the wirings 240 and the vias 260 therein. The second insulating interlayer 220 may include, e.g., silicon oxide doped with fluorine or carbon, a porous silicon oxide, spin on organic polymer, or an inorganic polymer, e.g., hydrogen silsesquioxane (HSSQ), methyl silsesquioxane (MSSQ), etc.

One or a plurality of wirings 240 and the vias 260 connecting the plurality of wirings 240 may be formed in the second insulating interlayer 220. In an implementation, as illustrated in the figure, the wirings 240 include first to third wirings 232, 234 and 236 sequentially stacked, and the vias 260 include first and second vias 252 and 254 sequentially stacked. In an implementation, a plurality of wirings at a plurality of levels and a plurality of vias may be formed.

Each of the wirings 240 and the vias 260 may include a conductive pattern and a barrier pattern covering a surface of the conductive pattern. The conductive pattern may include a metal, e.g., copper, aluminum, tungsten, titanium, tantalum, etc., and the barrier pattern may include a metal nitride, e.g., titanium nitride, tantalum nitride, tungsten nitride, copper nitride, aluminum nitride, etc.

The first conductive bump 280 may contact the third wiring 236, and may include a metal, e.g., silver, copper, etc., or a metal alloy, e.g., solder.

The first through-hole electrode structure 215 may extend through the first insulating interlayer 160 and the substrate 100, and a portion of the first through-hole electrode structure 215 may be exposed from or at the second surface 102 of the substrate 100. In an implementation, the first through-hole electrode structure 215 may include a through-hole electrode and an insulating pattern 185 covering a sidewall of the through-hole electrode. The through-hole electrode may include a first conductive layer 200 and a first barrier pattern 195 covering a sidewall of the first conductive layer 200.

The first conductive layer 200 may include a metal, e.g., copper, aluminum, tungsten, etc., and the first barrier pattern 195 may include a metal nitride, e.g., titanium nitride, tantalum nitride, tungsten nitride, copper nitride, aluminum nitride, etc., and the insulation pattern 185 may include an oxide, e.g., silicon oxide or a nitride, e.g., silicon nitride.

The passivation layer 310 may cover a portion of a sidewall of the first through-hole electrode structure 215 exposed at the second surface 102 of the substrate 100. In an implementation, the passivation layer 310 may include a first oxide layer, a nitride layer, and a second oxide layer sequentially stacked on the second surface 102 of the substrate 100.

An alignment key 315 may be formed on a portion of the passivation layer 310 in the second region II.

The first redistribution layer may be formed on the passivation layer 310 to contact the first through-hole electrode structure 215. Referring to FIG. 11 or FIGS. 9A, 9B and 9C, the first redistribution layer may have a bar shape extending in a direction or a bar shape of which an end has a circular shape in a plan view, and may include a third opening 390 (refer to FIG. 10) having a circular shape or a rectangular shape exposing the passivation layer 310.

In an implementation, the first redistribution layer may include a sequentially stacked second barrier pattern 345 and second conductive layer 380. The second barrier pattern 345 may include a metal nitride, e.g., titanium nitride, tantalum nitride, tungsten nitride, copper nitride, aluminum nitride, etc., and the second conductive layer 380 may include a metal, e.g., copper, aluminum, tungsten, etc.

The first protection layer 400 may be formed on the passivation layer 310, and may cover the first redistribution layer and the alignment key 315. In an implementation, the first protection layer 400 may include a fourth opening 410 (refer to FIG. 12) overlapping the third opening 390 to be connected thereto and having an area equal to or greater than that of the third opening 390 in a plan view. In an implementation, the fourth opening 410 may have a sidewall that is not perpendicular to an upper surface of the substrate 100 (e.g., the sidewall may be slanted or inclined relative to the upper surface of the substrate 100). For example, the fourth opening 410 may have a width that gradually increases from a bottom toward a top thereof (e.g., in a direction away from the substrate 100).

In an implementation, the first protection layer 400 may include or be formed from a photosensitive organic material, and may include a thermosetting organic polymer and a photosensitive material. The thermosetting organic polymer may include, e.g., polyimide, novolac, polybenzoxazole (PBO), benzocyclobutene, silicon polymer, epoxy polymer, acrylate polymer, etc.

The first conductive pad 480 may fill the third opening 390 in the first redistribution layer and a portion of the fourth opening 410 in the first protection layer 400. Thus, the first conductive pad 480 may include the penetrating portion 480*a* extending through the first redistribution layer and the protrusion portion 480*b*, which may be integrally formed with the penetrating portion 480*a* and protrude from the upper surface of the first redistribution layer.

In an implementation, a sidewall of the penetrating portion 480*a* may be substantially perpendicular to the upper surface of the substrate 100, and a sidewall of the protrusion portion 480*b* may be slanted or inclined with respect to the upper surface of the substrate 100. In an implementation, an upper edge surface of the protrusion portion 480*b* may have a slope opposite to that of the sidewall of the protrusion portion 480*b* (e.g., the outer edge of the upper surface of the protrusion portion 480*b* may slant inwardly in the fourth opening 410 as the sidewall of the protrusion portion 480*b* slants outwardly).

The first conductive pad 480 may include a third conductive layer 460, a first capping layer 470 covering at least a portion of an upper surface of the first conductive layer 460, and a third barrier pattern 425 covering a bottom and a sidewall of the third conductive layer 460.

In an implementation, an upper surface of each of the third conductive layer 460 and the first capping layer 470 may be flat, and thus at least a central upper surface of the first conductive pad 480 may be flat. In an implementation, the central upper surface of the first conductive pad 480 may not be lower than an edge upper surface thereof (e.g., a distance from the substrate 100 to the central region of the upper surface of the first conductive pad may be equal to or greater than a distance from the substrate 100 to an outer edge of the upper surface of the protrusion portion 480*b*).

In an implementation, the upper surface of the first conductive pad 480 may be lower (e.g., closer to the substrate 100) than an upper surface of the first protection layer 400 covering the sidewall of the first conductive pad 480. Thus, exposure of the third conductive layer 460 of the first conductive pad 480 may be minimized so that the oxidation thereof may be prevented or reduced.

The second semiconductor chip 500 may include a fourth wiring 510 at a lower portion thereof, and may be electrically connected to the first conductive pad 480 through the sequentially stacked second conductive pad 520 and second conductive bump 530.

The first semiconductor chip and the second semiconductor chip 500 may be bonded with each other by a first non-conductive layer 490. In an implementation, when the first semiconductor chip and the second semiconductor chip 500 are bonded with each other, the first conductive pad 480 and the second conductive bump 530 may contact each other, and at least the central upper surface of the first conductive pad 480 is flat and no lower than the edge upper surface thereof, so that the first non-conductive layer 490 may not remain between the first conductive pad 480 and the second conductive bump 530. Accordingly, contact resistance between the first conductive pad 480 and the second conductive bump 530 may not increase, and the reliability of the semiconductor device may be enhanced, which will be explained in detail subsequently.

Figure 2:
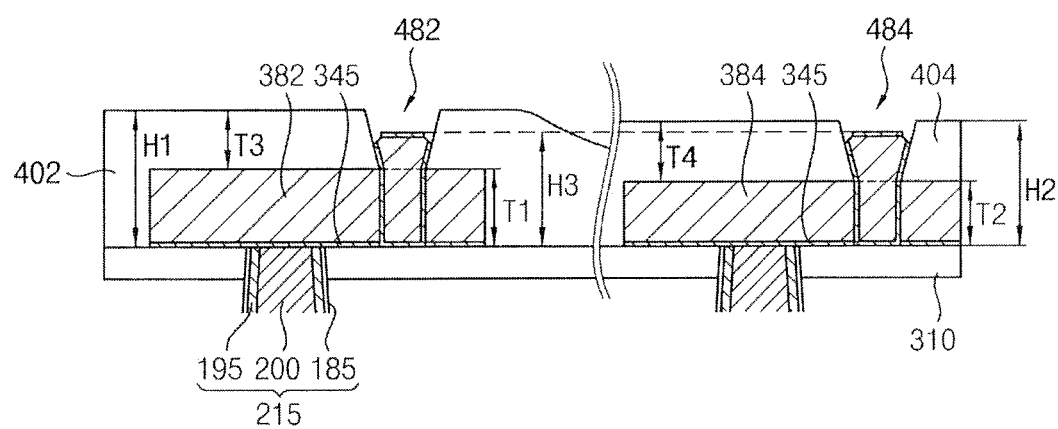
FIG. 2 illustrates a cross-sectional view of the first semiconductor chip including a plurality of redistribution layers and a plurality of first conductive pads.

FIG. 2 illustrates a cross-sectional view of the first semiconductor chip including a plurality of redistribution layers and a plurality of first conductive pads. For the convenience of explanation, only some elements are shown in FIG. 2.

Referring to FIG. 2, when a plurality of redistribution layers is formed, there may be a thickness distribution or difference therebetween, and a protection layer covering the redistribution layers may have a thickness distribution between portions thereof.

FIG. 2 shows second and third redistribution layers having first and second thicknesses T1 and T2, respectively, and second and third protection layers 402 and 404 having third and fourth thicknesses T3 and T4, respectively, and upper surfaces having first and second heights H1 and H2, respectively. The second and third redistribution layers may include fourth and fifth conductive layers 382 and 384, respectively, having different thicknesses from each other.

The third and fourth conductive pads 482 and 484 extending through the second and third redistribution layers and protruding upwardly may be formed by a electroplating process from the flat upper surface of the passivation layer 310 (refer to FIGS. 13 and 14), and thus may have a uniform thickness or height regardless of the thicknesses of the second and third redistribution layers or the thickness and heights of the second and third protection layers 402 and 404, so that upper surfaces of the third and fourth conductive pads 482 and 484 may commonly have a third height H3.

For example, a plurality of conductive pads may have a uniform thickness, regardless of the thickness distribution of the redistribution layer, the thickness distribution of the protection layer and/or the height distribution of the protection layer.

FIGS. 3 to 22 illustrate plan views and cross-sectional views of stages in a method of manufacturing a semiconductor device in accordance with example embodiments. FIGS. 9A, 9B, 9C and 11 are plan views and FIGS. 3 to 8, 10, and 12 to 22 are cross-sectional views.

Figure 3:
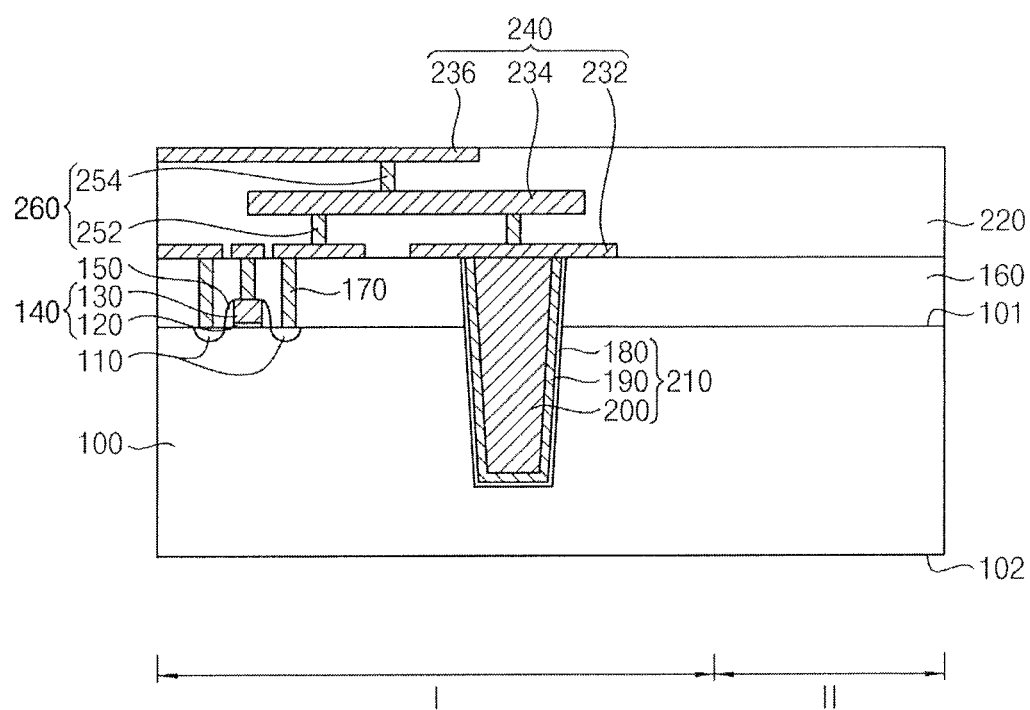
FIGS. 3 to 22 illustrate plan views and cross-sectional views of stages in a method of manufacturing a semiconductor device in accordance with example embodiments.

Referring to FIG. 3, circuit elements and a contact plug 170 may be formed on a first surface 101 of a substrate 100.

A transistor serving as the circuit elements may be formed. The transistor may include a gate structure 140 including a gate insulation pattern 120 and a gate electrode 130 sequentially stacked on the first surface 101 of the substrate 100, and an impurity region 110 doped with impurities at a portion of the substrate 100 adjacent to the gate structure 140. A gate spacer 150 may be further formed on a sidewall of the gate structure 140.

A first insulating interlayer 160 may be formed on the substrate 100 to cover the circuit elements, and the contact plug 170 may be formed through the first insulating interlayer 160 to contact the impurity region 110.

A preliminary through-hole electrode structure 210 may be formed and may extend partially through the substrate 100.

For example, a first photoresist pattern partially exposing the first region I of the substrate 100 may be formed on the first insulating interlayer 160 and the contact plug 170, and the first insulating interlayer 160 and the substrate 100 may be etched using the first photoresist pattern as an etching mask to form a first trench. An insulation layer 180 and a first barrier layer 190 may be sequentially formed on an inner wall of the first trench, the first insulating interlayer 160, and the contact plug 170, and a first conductive layer 200 may be formed on the first barrier layer 190 to sufficiently fill the first trench.

The first conductive layer 200, the first barrier layer 190, and the insulation layer 180 may be planarized until a top surface of the first insulating interlayer 160 is exposed to form the preliminary through-hole electrode structure 210 filling the first trench.

A second insulating interlayer 220 may be formed on the first insulating interlayer 160, the contact plug 170, and the preliminary through-hole electrode structure 210, and one or a plurality of wirings 240 and vias 260 connecting the plurality of wirings 240 may be formed in the second insulating interlayer 220 in the first region I.

In the figures, first to third wirings 232, 234 and 236 sequentially stacked and first and second vias 252 and 254 sequentially stacked are shown.

In an implementation, the wirings 240 and the vias 260 may be formed by a double damascene process or a single damascene process. Each of the wirings 240 and the vias 260 may include a conductive pattern and a barrier pattern covering a surface of the conductive pattern.

Figure 4:
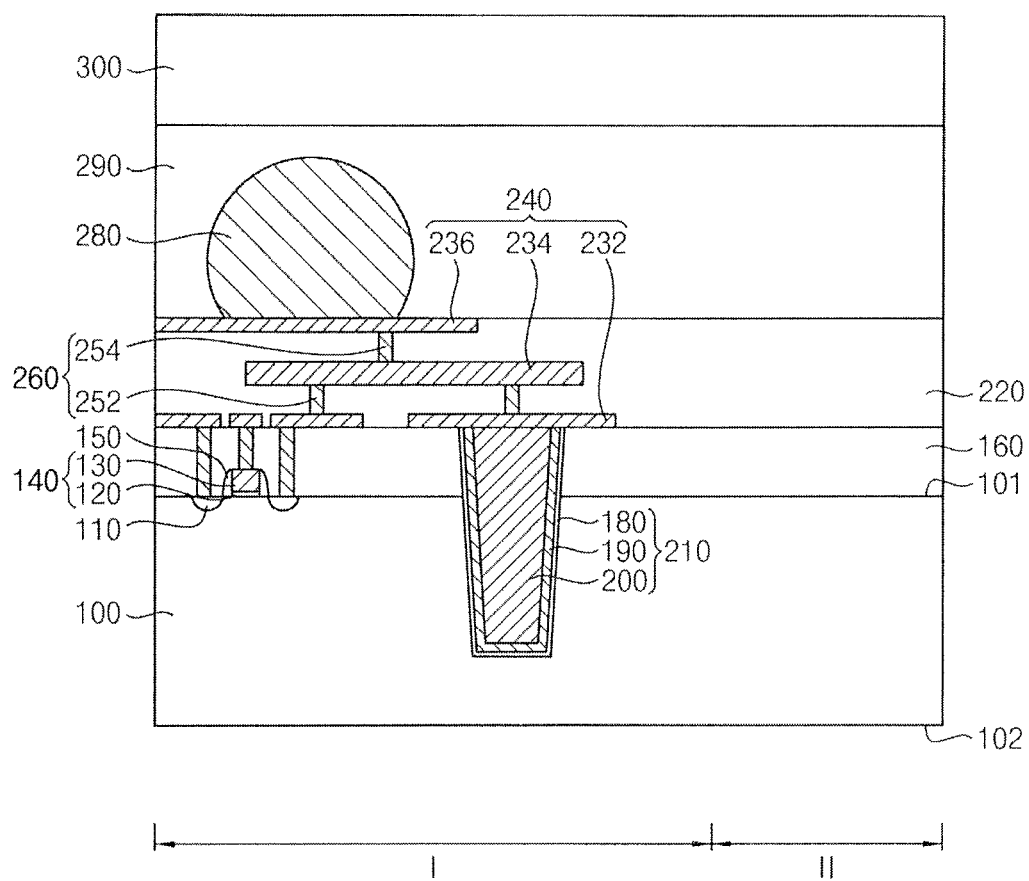

Referring to FIG. 4, after a first conductive bump 280 is formed on the second insulating interlayer 220 to contact an upper surface of the third wiring 236, an adhesion layer 290 may be formed on the second insulating interlayer 220 and the third wiring 236, and a handling substrate 300 may be adhered thereto.

Figure 5:
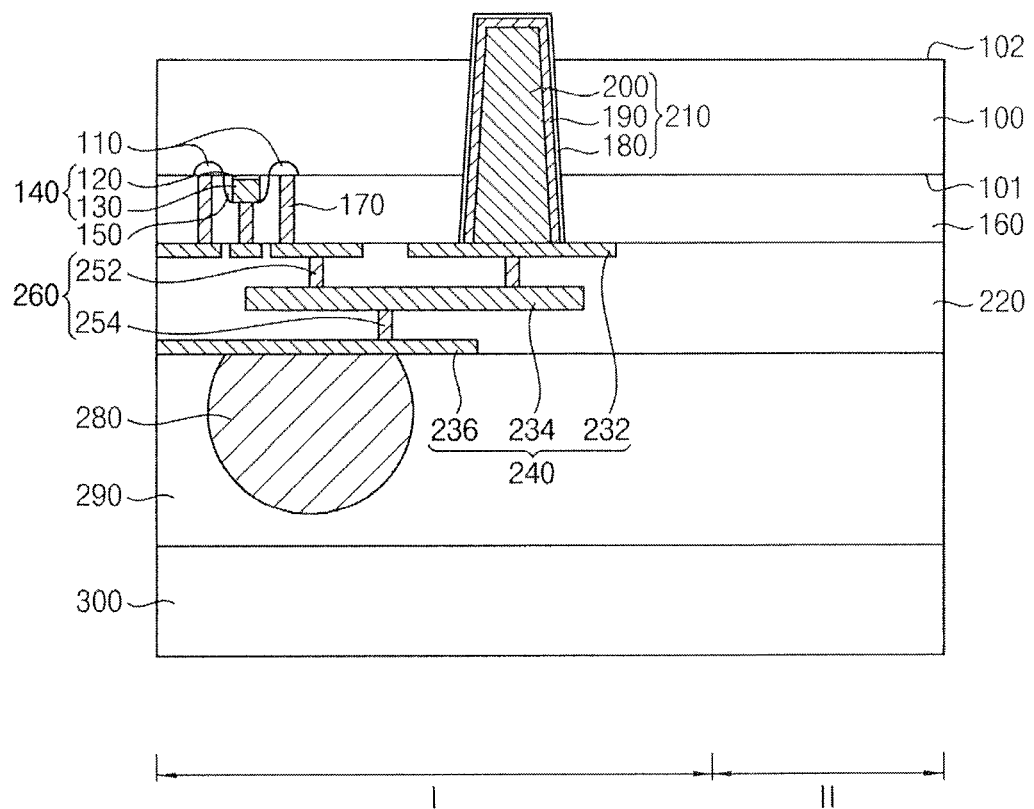

Referring to FIG. 5, the substrate 100 may be overturned using the handling substrate 300 so that the second surface 102 of the substrate 100 may face upward (e.g., as shown in the figure). A portion of the substrate 100 adjacent to or at the second surface 102 thereof may be removed to expose a portion of the preliminary through-hole electrode structure 210. Thus, the substrate 100 may be partially removed by, e.g., an etch back process or a grinding process.

Figure 6:
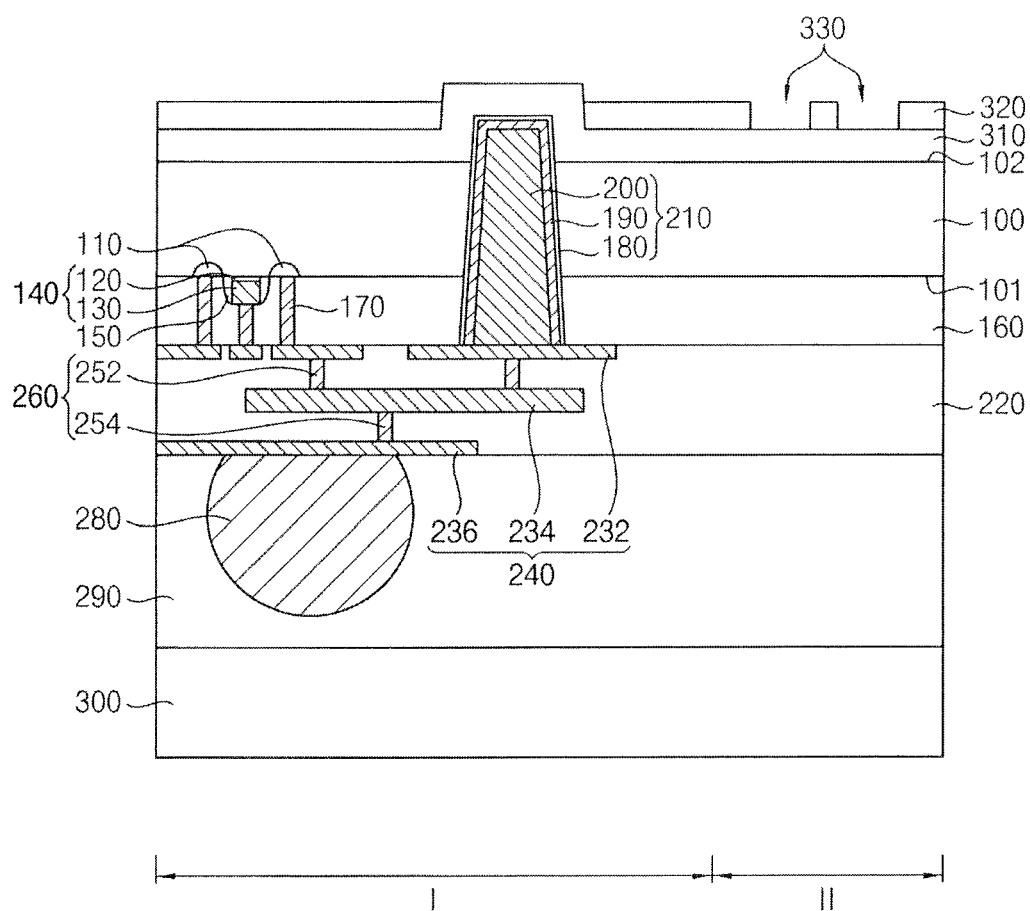

Referring to FIG. 6, a passivation layer 310 may be formed on the second surface 102 of the substrate 100 and the exposed portion of the preliminary through-hole electrode structure 210, and a second photoresist pattern 320 may be formed on the passivation layer 310.

In an implementation, the passivation layer 310 may include a first oxide layer, a nitride layer, and a second oxide layer sequentially stacked.

In an implementation, the second photoresist pattern 320 may be formed to have an upper surface lower than that of a portion of the passivation layer 310 on the exposed portion of the preliminary through-hole electrode structure 210 above the second surface 102 of the substrate 100. In an implementation, the second photoresist pattern 320 may include a first opening 330 for an alignment key in the second region H.

Figure 7:
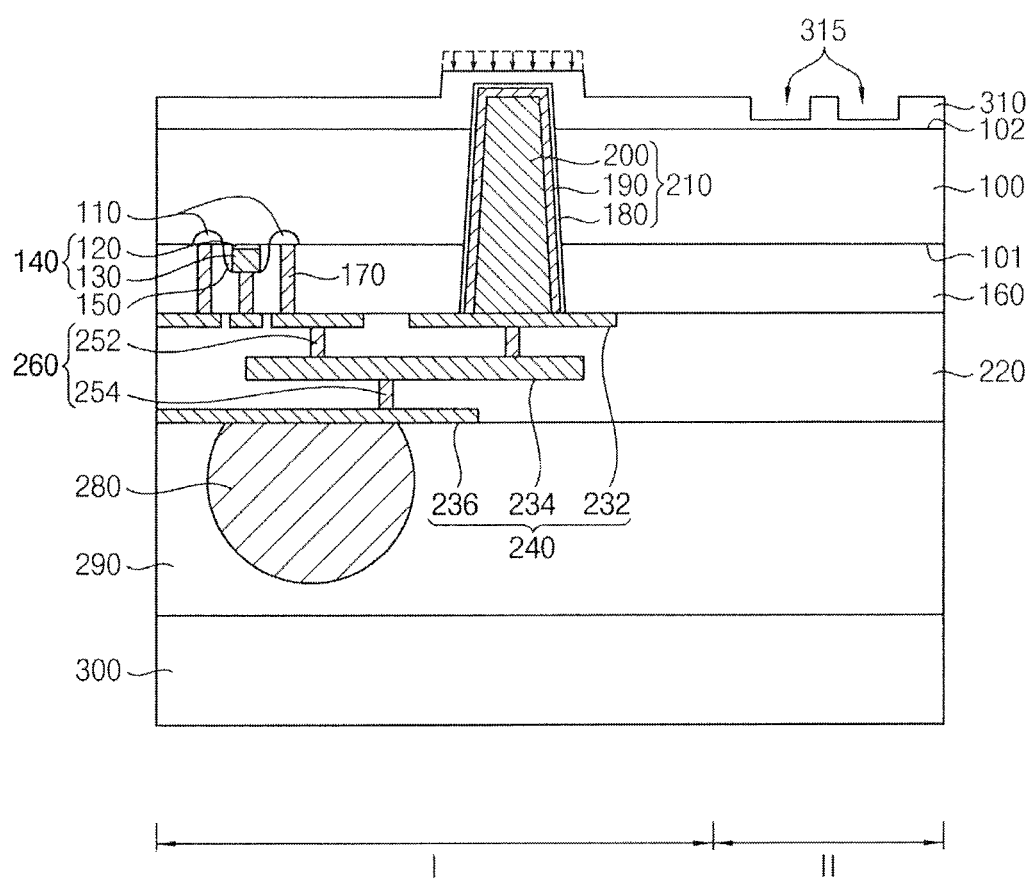

Referring to FIG. 7, the passivation layer 310 may be partially etched using the second photoresist pattern 320 as an etching mask to form an alignment key 315 on the passivation layer 310 in the second region II.

A portion of the passivation layer 310 on the preliminary through-hole electrode structure 210 may not be covered by the second photoresist pattern 320, and thus may be partially etched so that a height of the upper surface of the passivation layer 310 may be lowered.

After the etching process, the second photoresist pattern 320 may be removed.

Figure 8:
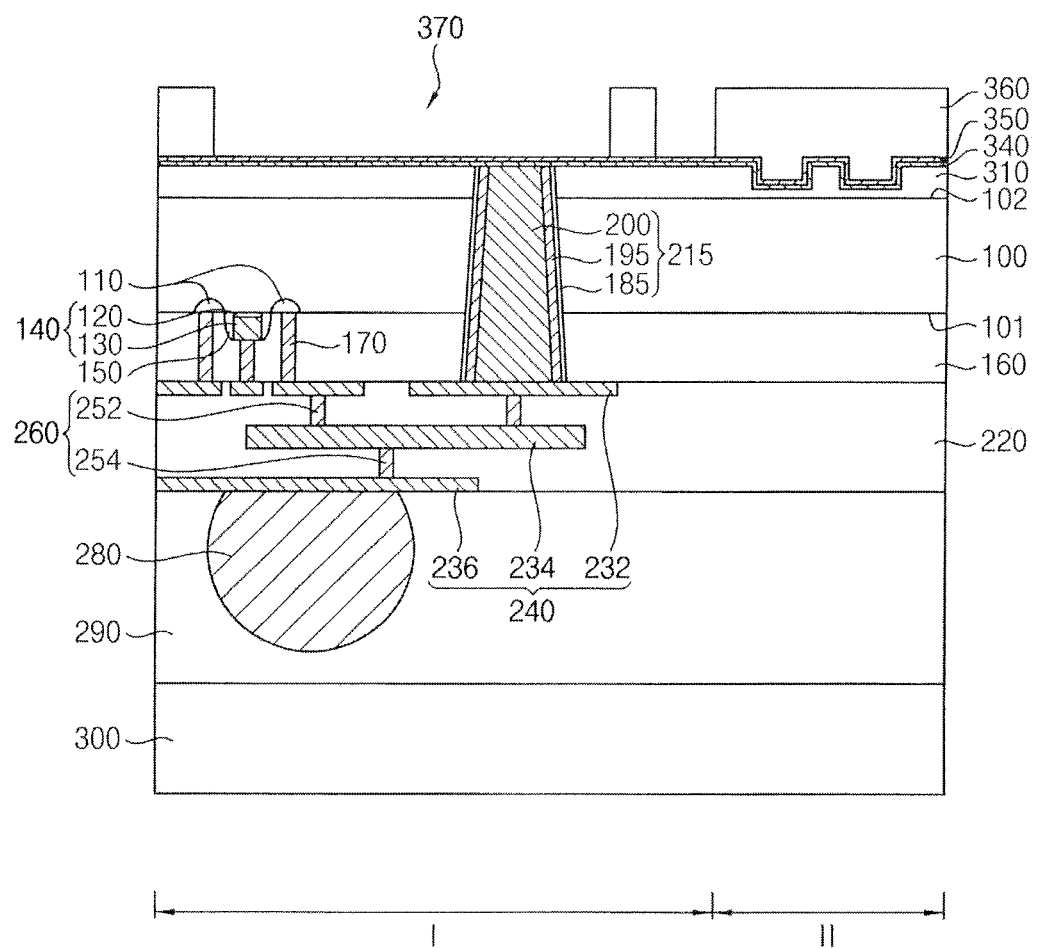

Referring to FIG. 8, an upper portion of the passivation layer 310 may be planarized until an upper surface of the first conductive layer 200 is exposed.

Thus, portions of the insulation layer 180 and the first barrier layer 190 on the first conductive layer 200 of the preliminary through-hole electrode structure 210 may be removed to form an insulation pattern 185 and a first barrier pattern 195, respectively, and a first through-hole electrode structure 215 including the first conductive layer 200, and the first barrier pattern 195 and the insulation pattern 185 sequentially stacked on a sidewall of the first conductive layer 200 may be formed.

A portion of the passivation layer 310 in the first region I may have a flat upper surface by the planarization process, and the alignment key 315 may still remain on a portion of the passivation layer 310 in the second region II.

In an implementation, the planarization process may include a chemical mechanical polishing (CMP) process and/or an etch back process.

A second barrier layer 340 and a first seed layer 350 may be sequentially formed on the passivation layer 310, and a third photoresist pattern 360 may be formed on the first seed layer 350.

The first seed layer 350 may include a metal, e.g., copper, ruthenium, nickel, gold, tungsten, etc. In an implementation, the first seed layer 350 may be formed by a physical vapor deposition (PVD) process.

The third photoresist pattern 360 may include a second opening 370 exposing a portion of the first seed layer 350 on an upper surface of the first through-hole electrode structure 215 in the first region I.

Figure 9A:
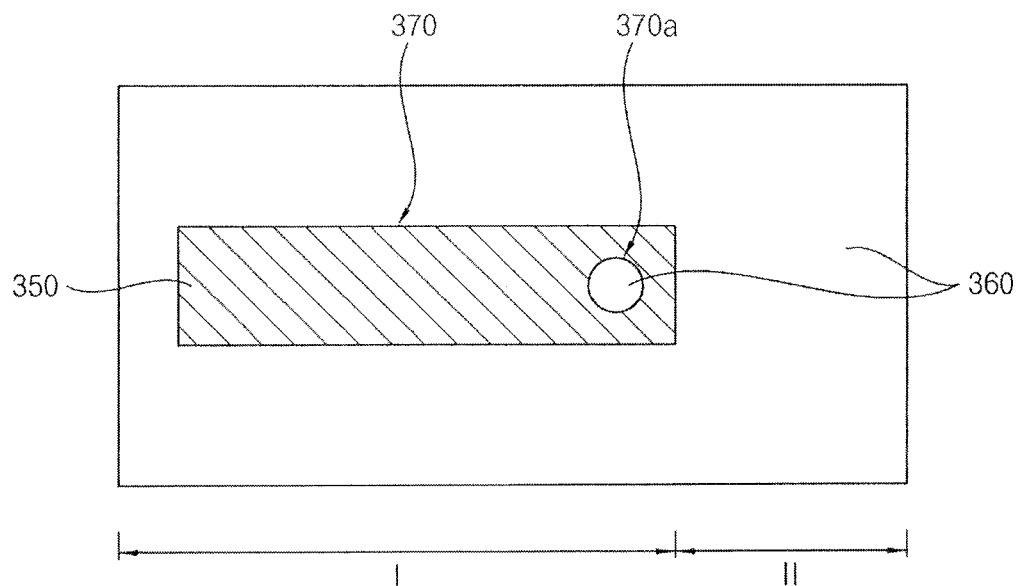
Figure 9B:
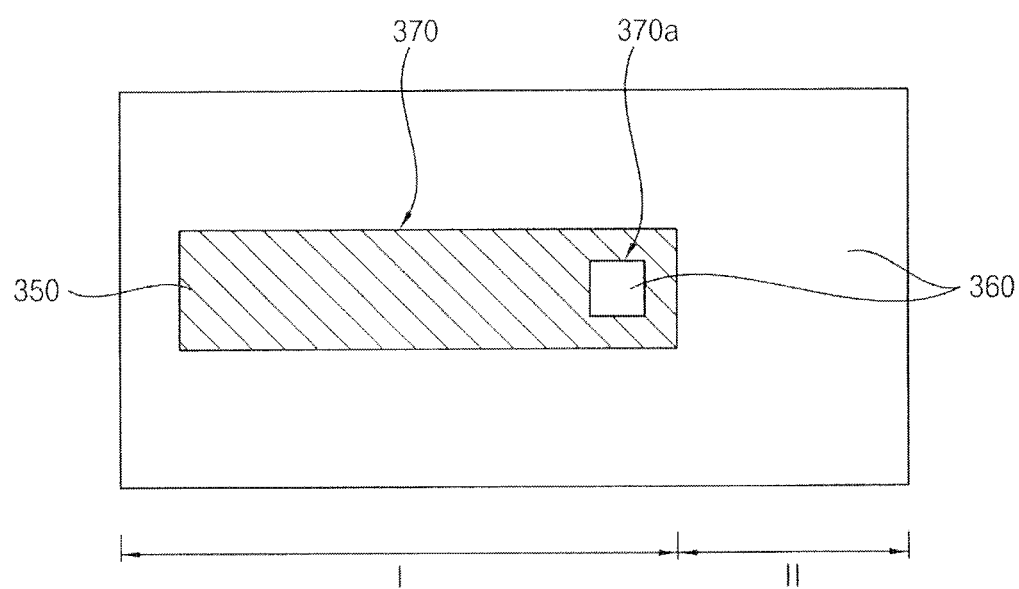
Figure 9C:
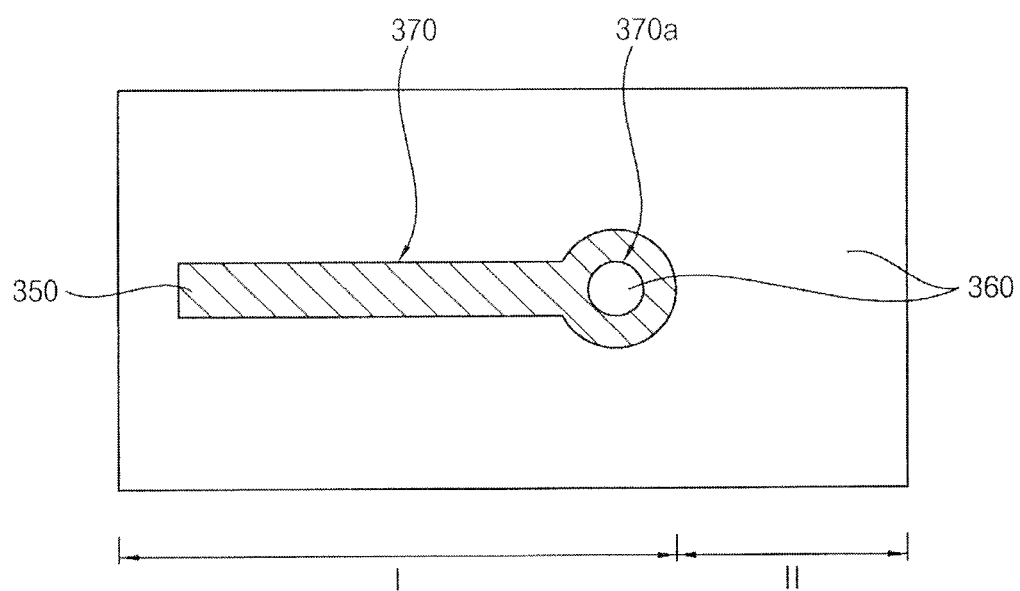

Referring to FIGS. 9A, 9B and 9C, the second opening 370 may have a bar shape extending in a direction or a bar shape of which an end has a circular shape in a plan view, however, may include a non-exposure portion 370a therein that does not expose the first seed layer 350.

Figure 10:
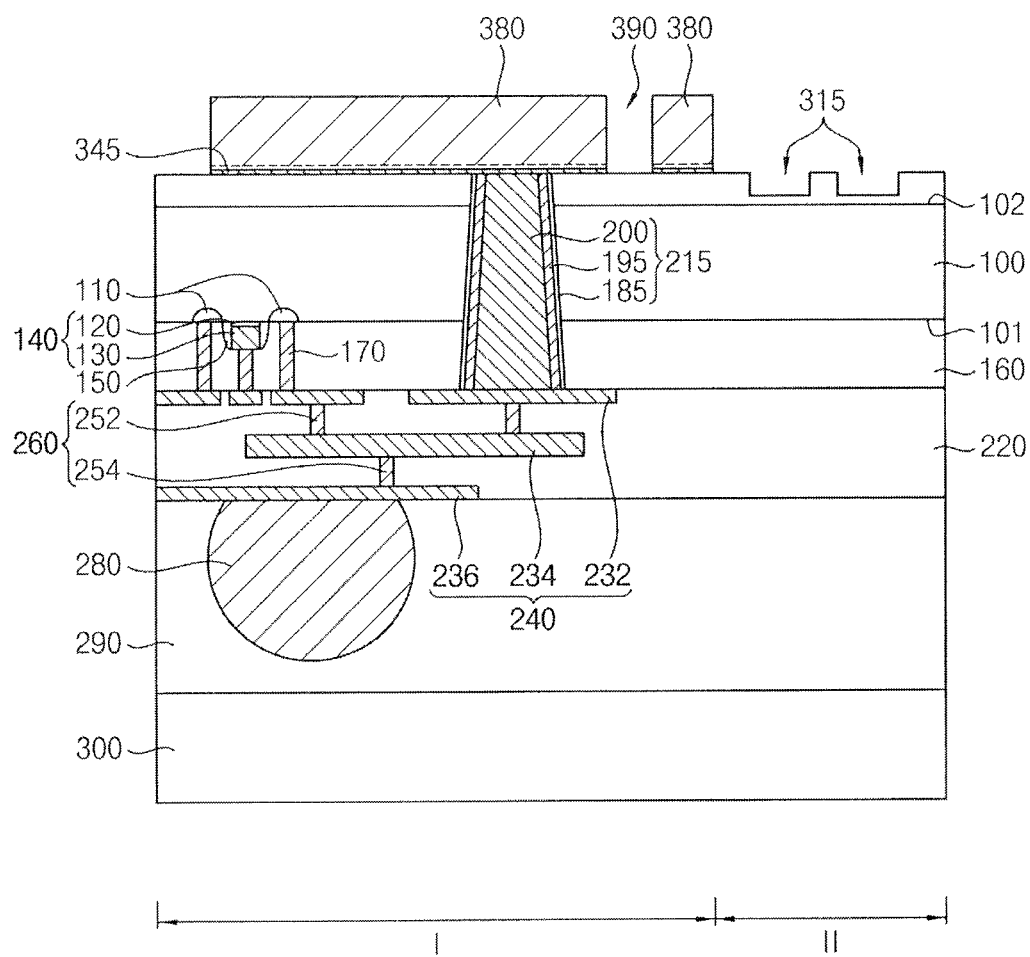

Referring to FIG. 10, an electroplating process may be performed using the exposed portion of the first seed layer 350 as a seed to form a second conductive layer 380 filling the second opening 370.

In an implementation, the electroplating process may be performed using a plating solution including an electrolyte solution containing copper ion, ruthenium ion, nickel ion, tungsten ion, etc.

The third photoresist pattern 360 may be removed to expose a portion of the first seed layer 350, and the exposed portion of the first seed layer 350 and a portion of the second barrier layer 340 thereunder may be removed. Thus, the second barrier layer 340 may be transformed into a second barrier pattern 345, and the second barrier pattern 345 and the second conductive layer 380 sequentially stacked may form a first redistribution layer.

Figure 11:
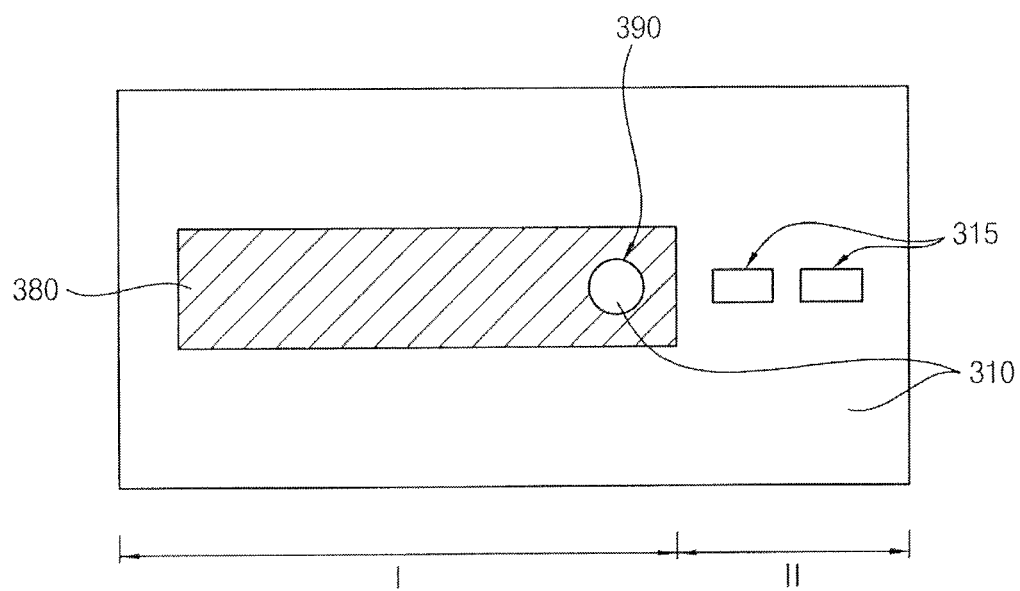

Referring to FIG. 11, a third opening 390 may be formed through the first redistribution layer, and the alignment key 315 may be exposed again in the second region II.

FIG. 11 shows the shape of the first redistribution layer that may be formed from the second opening 370 of FIG. 9A. In an implementation, the first redistribution layer may have shapes from the second openings 370 shown in FIGS. 9B and 9C.

Figure 12:
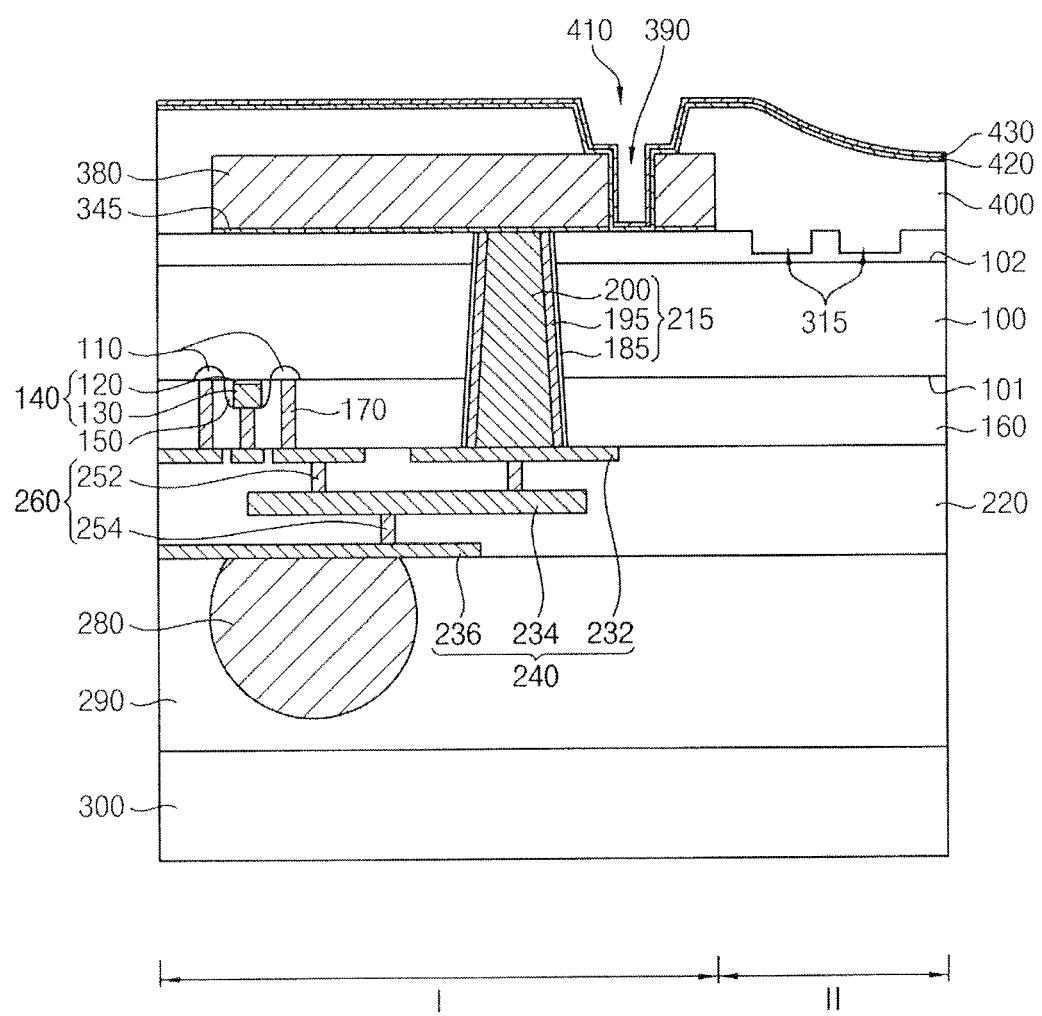

Referring to FIG. 12, a first protection layer 400 may be formed on the passivation layer 310 to cover the first redistribution layer and the alignment key 315.

In an implementation, the first protection layer 400 may include a fourth opening 410 overlapping and connected to the third opening 390, and may have an area equal to or greater than that of the third opening 390 in a plan view.

In an implementation, the first protection layer 400 may include or be formed from a photosensitive organic material, and may include a thermosetting organic polymer and a photosensitive material. In an implementation, the first protection layer 400 may be formed by a spin coating process, and may be hardened by a heat treatment. In an implementation, the fourth opening 410 in the protection layer 400 may have a sidewall that is not perpendicular to an upper surface of the substrate 100, but rather is slanted or inclined relative thereto by the heat treatment, and thus may have a width gradually increasing from a bottom toward a top thereof (e.g., in a direction away from the substrate 100).

A third barrier layer 420 and a second seed layer 430 may be sequentially formed on a bottom of the third opening 390, i.e., the exposed upper surface of the passivation layer 310 by the third opening 390, inner walls of the third and fourth openings 390 and 410, and an upper surface of the protection layer 400.

Figure 13:
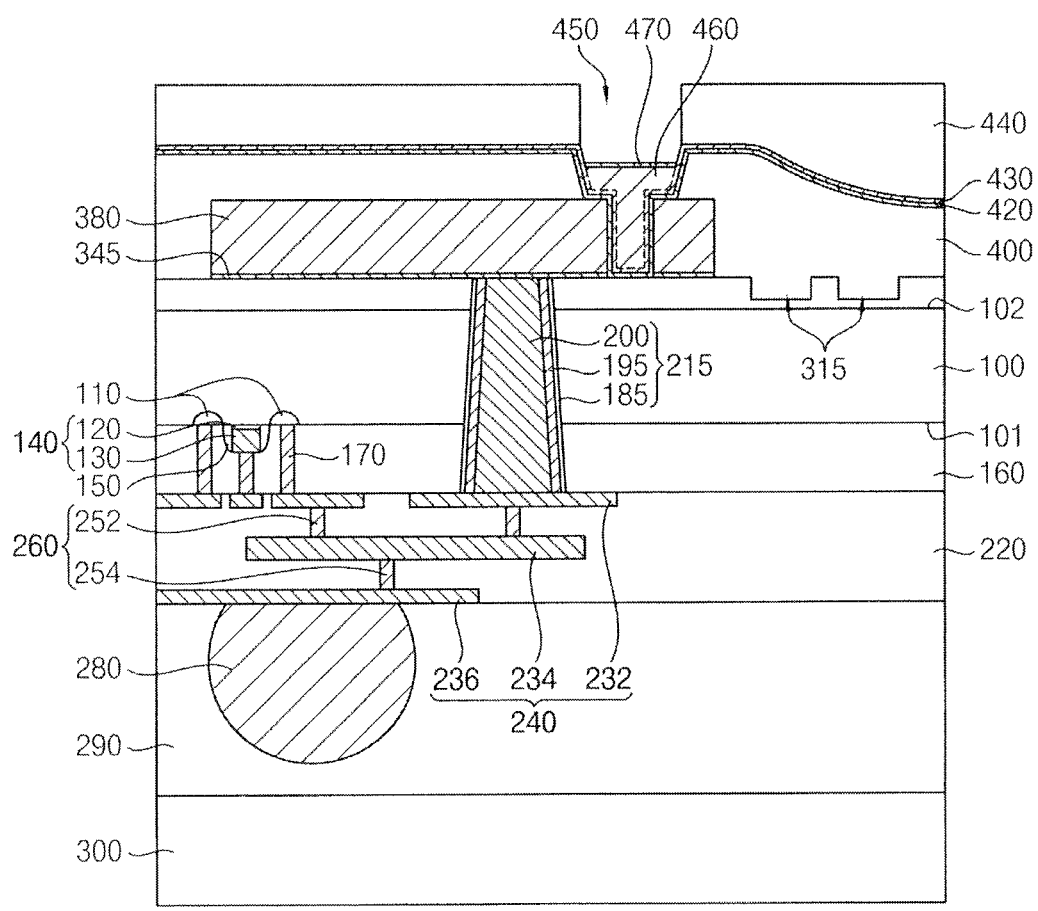

Referring to FIG. 13, a fourth photoresist pattern 440 including a fifth opening 450 may be formed on the second seed layer 430.

The fifth opening 450 may overlap and may be connected to the fourth opening 410. The fifth opening 450 may have a shape and area substantially the same as those of the fourth opening 410 in a plan view. Thus, portions of the second seed layer 430 on bottoms and sidewalls of the third and fourth openings 390 and 410 may be exposed by the fifth opening 450.

An electroplating process may be performed using the exposed portions of the second seed layer 430 as a seed to form a third conductive layer 460 filling the third opening 390 and a portion of the fourth opening 410, and a first capping layer 470 may be formed on the third conductive layer 460.

The electroplating process may be performed using a plating solution including an electrolyte solution containing metal ions, e.g., copper ion, ruthenium ion, nickel ion, tungsten ion, etc., and an additive.

In an implementation, the metal ions may include copper ion and nickel ion, and thus the third conductive layer 460 may include copper and the first capping layer may include nickel.

In example embodiments, the additive may include at least a leveler, and further include a suppressor or an accelerator. The leveler may include a polymer, e.g., polyimide, polyamide, etc., the suppressor may include a polymer, e.g., polyethylene glycol (PEG), and the accelerator may include an organic sulfur compound.

The leveler may be disposed mostly at an entrance of the fourth opening 410 to delay metal plating. The accelerator may have a relatively small molecular size, and thus may easily penetrate into the third opening 390. However, the suppressor may have a relatively large molecular size, and thus may not easily penetrate into the third and fourth openings 390 and 410 and may be disposed mostly on an upper surface of the fourth photoresist pattern 440.

Thus, the metal plating may be accelerated by the accelerator in the third opening 390, and may be delayed by the leveler and/or the suppressor at the entrance of the fourth opening 410, on a sidewall of the fifth opening 450, and on the upper surface of the fourth photoresist pattern 440. Accordingly, when the third opening 390 and a lower portion of the fourth opening 410 are filled, the third conductive layer 460 and the first capping layer 470 may not be formed in an upper portion of the fourth opening 410 and the fifth opening 450, and thus each of the third conductive layer 460 and the first capping layer 470 may have a flat upper surface.

Figure 14:
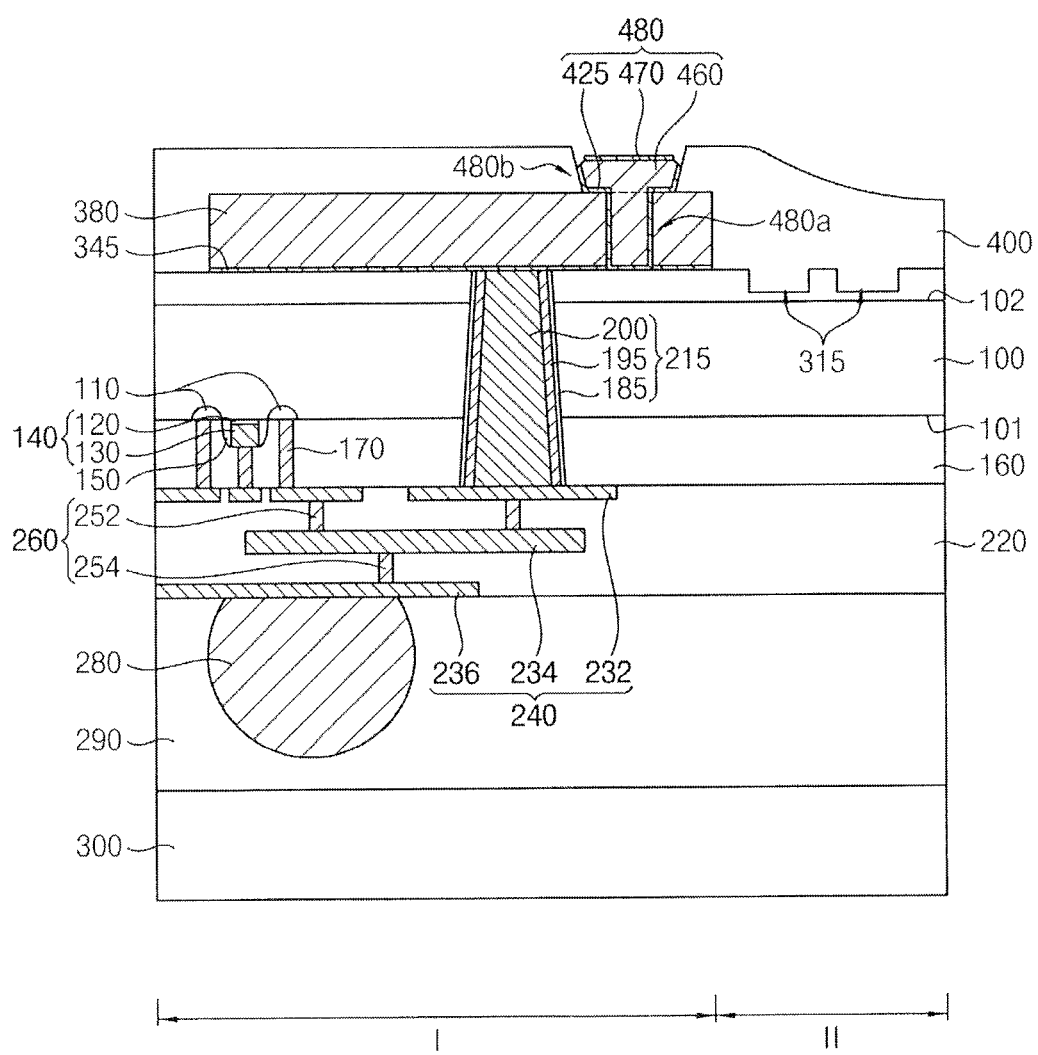

Referring to FIG. 14, after removing the fourth photoresist pattern 440 by, e.g., an ashing process and/or a stripping process, an exposed portion of the second seed layer 430 and a portion of the third barrier layer 420 thereunder may be removed. Thus, the third barrier layer 420 may be transformed into a third barrier pattern 425.

In an implementation, the exposed portion of the second seed layer 430 and the portion of the third barrier layer 420 thereunder may be removed by a wet etching process.

The third conductive layer 460, the first capping layer 470 covering an upper surface of the third conductive layer 460, and the third barrier pattern 425 covering a bottom and a sidewall of the third conductive layer 460 may form a first conductive pad 480. The first conductive pad 480 may include a penetrating portion 480a extending through the first redistribution layer and a protrusion portion 480b on the penetrating portion 480a protruding from an upper surface of the first redistribution layer.

In an implementation, the upper surface of each of the third conductive layer 460 and the first capping layer 470 may be substantially flat, and thus at least a central upper surface of the first conductive pad 480 may be substantially flat. For example, as described above, the central upper surface of the first conductive pad 480 may not be lower than an edge upper surface thereof.

In an implementation, an upper surface of the first conductive pad 480 may be lower (e.g., closer to the substrate 100) than that of the first protection layer 400 covering a sidewall of the first conductive pad 480. Thus, the exposure of the third conductive layer 460 of the first conductive pad 480 may be minimized so that the oxidation thereof may be advantageously prevented or reduced.

The first semiconductor chip may be formed by the above processes.

Figure 15:
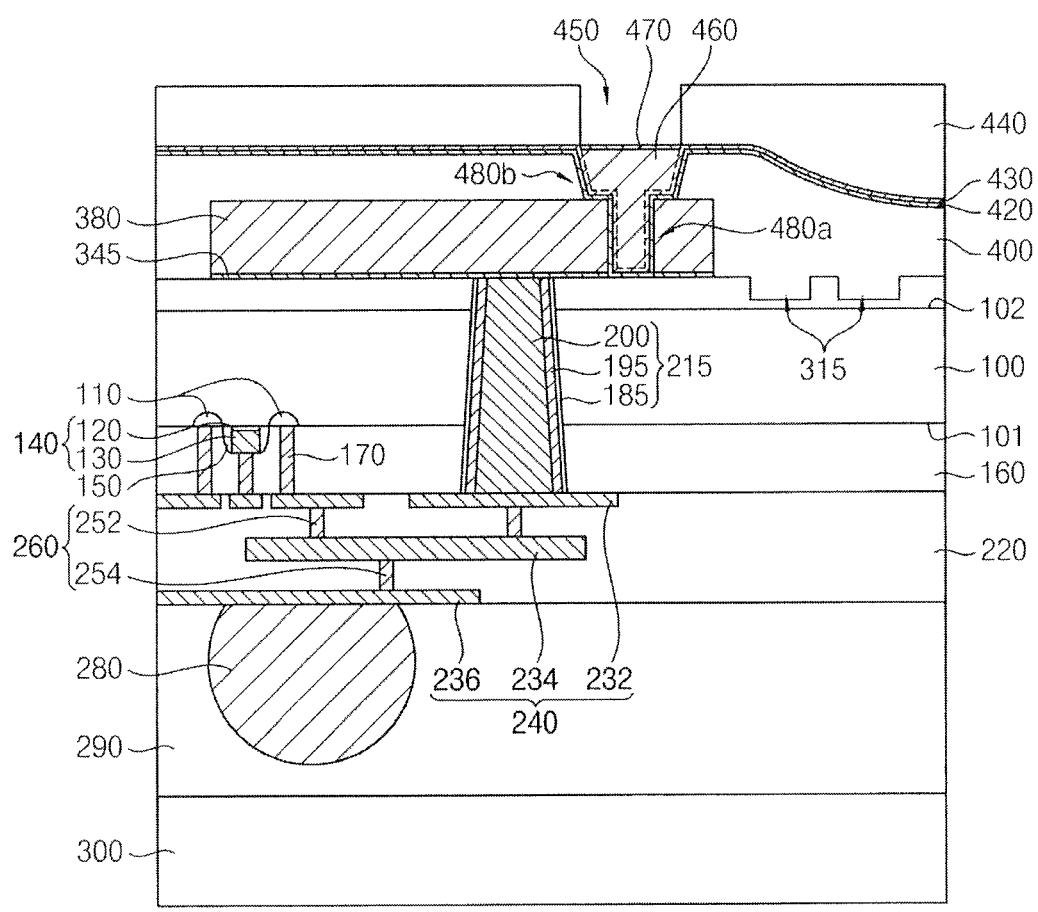

FIG. 15 shows a case in which the electroplating process illustrated with reference to FIG. 13 is performed until the height of the upper surface of the first capping layer 470 is equal to that of the upper surface of the second seed layer 430.

Figure 16:
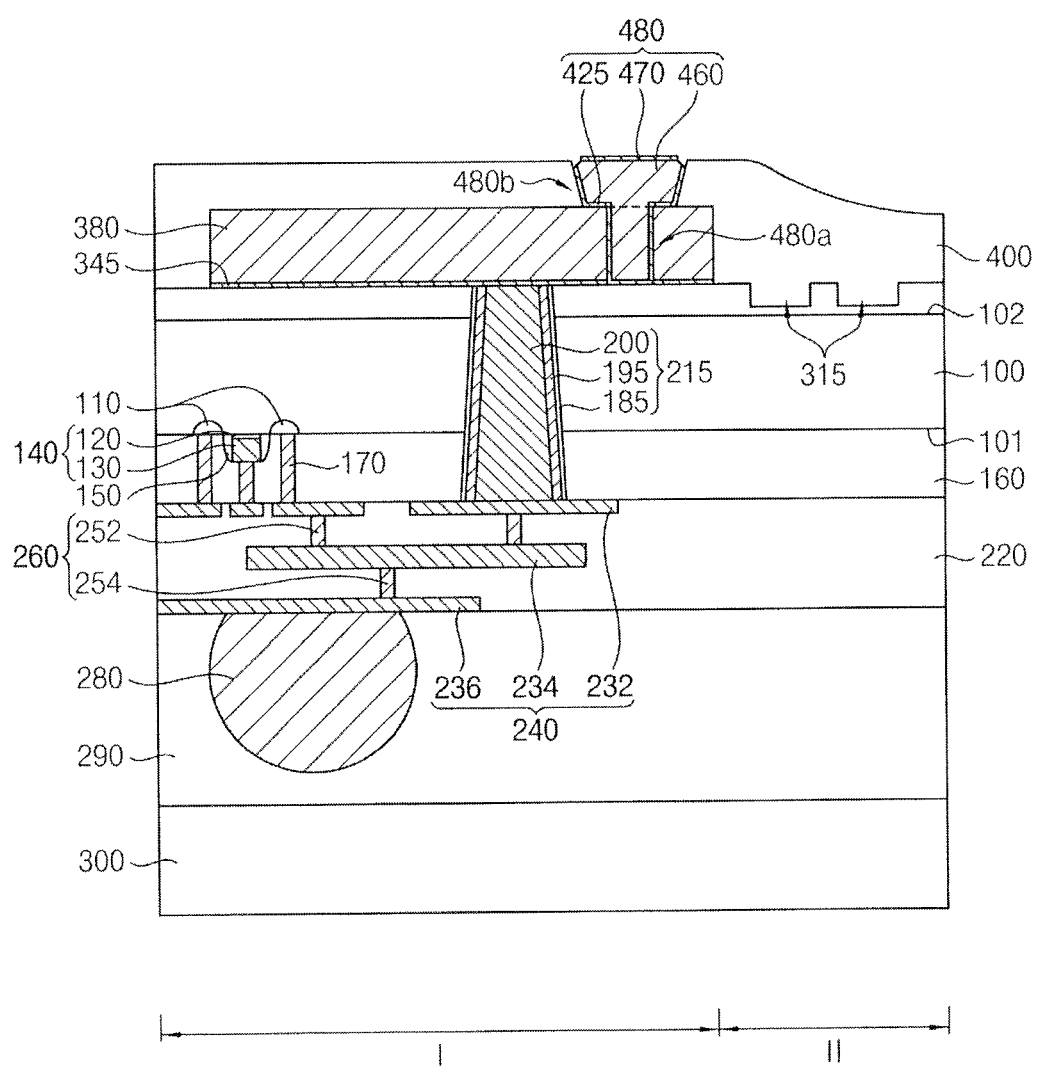

Referring to FIG. 16, the upper surface of the third conductive layer 460 or the upper surface of the first conductive pad 480 may be slightly higher than that of the first protection layer 400. However, like that of FIG. 14, at least the central upper surface of the first conductive pad 480 may be substantially flat, and the exposure of the third conductive layer 460 of the first conductive pad 480 may be minimized so that the oxidation thereof may be prevented or reduced.

Figure 17:
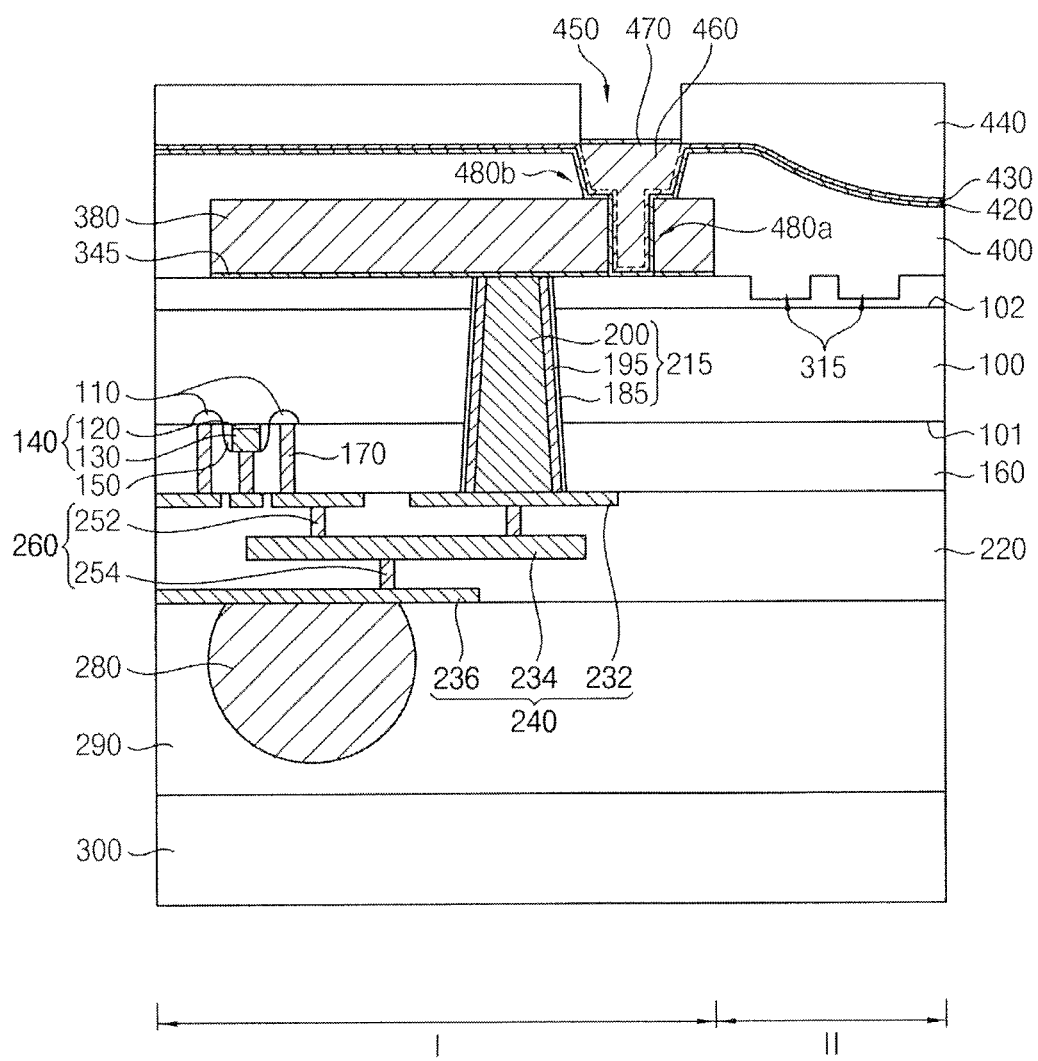

FIG. 17 shows a case in which the electroplating process illustrated with reference to FIG. 13 is performed until the height of the upper surface of the third conductive layer 460 is equal to that of the upper surface of the second seed layer 430.

Figure 18:
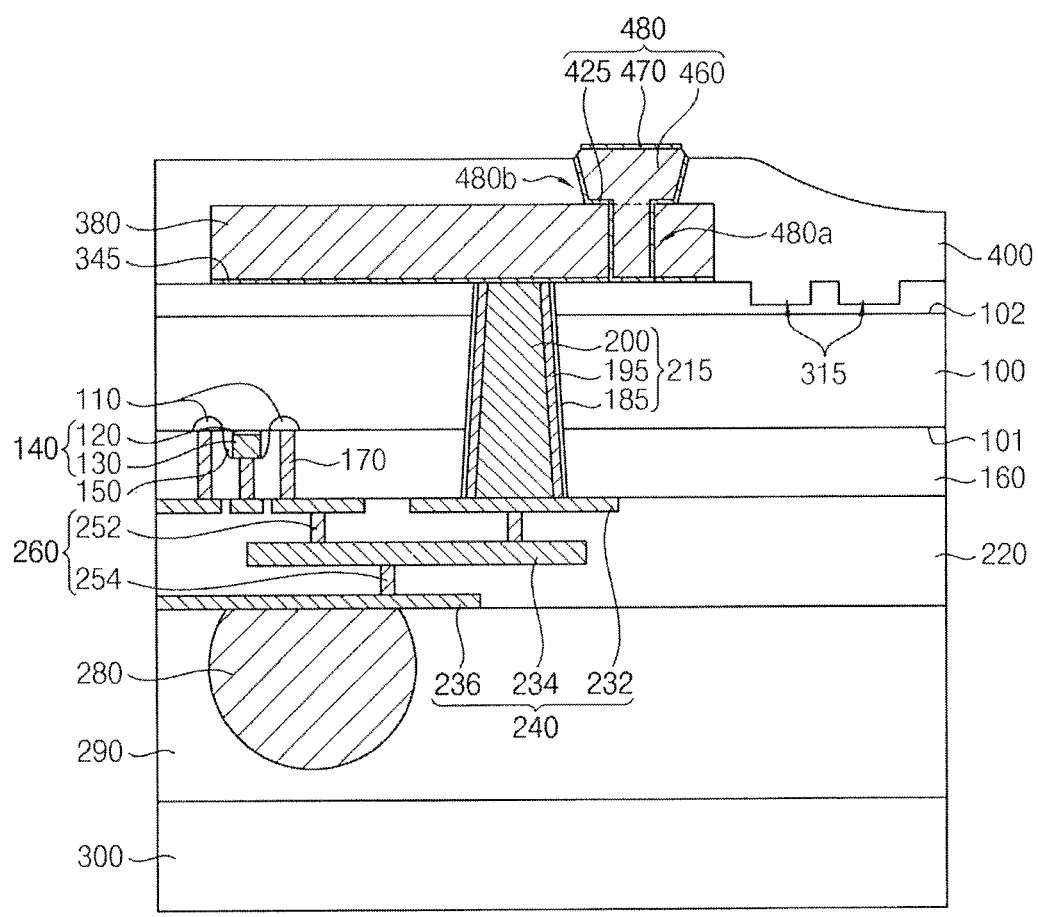

Referring to FIG. 18, the upper surface of the third conductive layer 460 or the upper surface of the first conductive pad 480 may be slightly higher than that of the first protection layer 400. However, like that of FIG. 14, at least the central upper surface of the first conductive pad 480 may be substantially flat, and the exposure of the third conductive layer 460 of the first conductive pad 480 may be minimized so that the oxidation thereof may be prevented or reduced.

Figure 19:
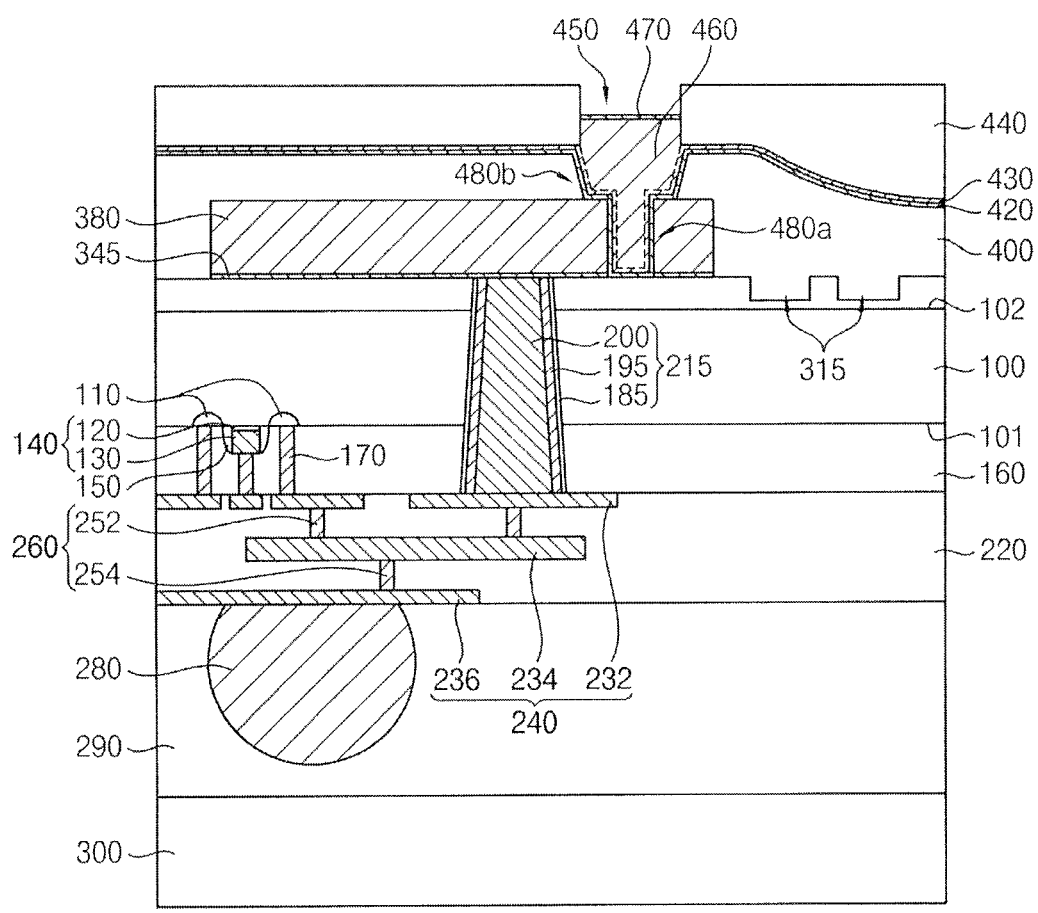

FIG. 19 shows a case in which the electroplating process illustrated with reference to FIG. 13 is performed until the third conductive layer 460 and the first capping layer 470 fill a lower portion of the fifth opening 450.

Figure 20:
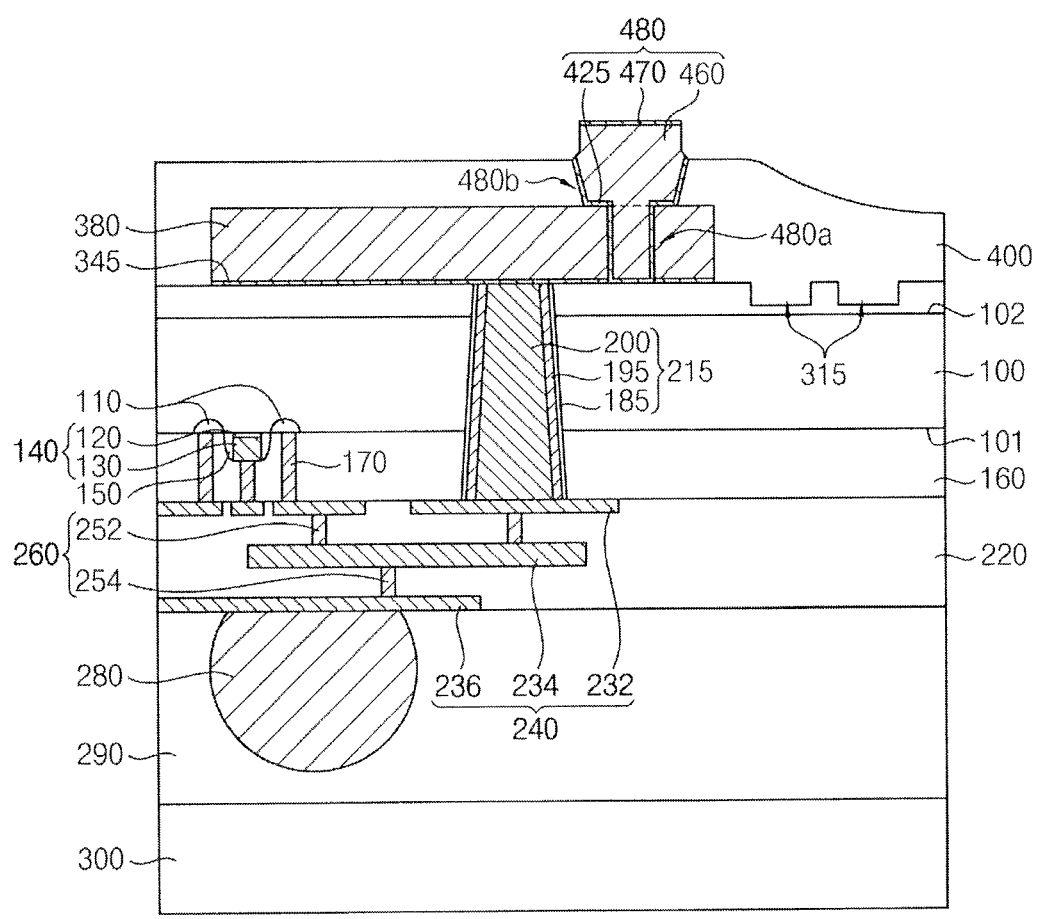

Referring to FIG. 20, the central upper surface of the first conductive pad 480 may be substantially flat, however, a sidewall of the third conductive layer 460 of the first conductive pad 480 may be partially exposed.

Figure 21:
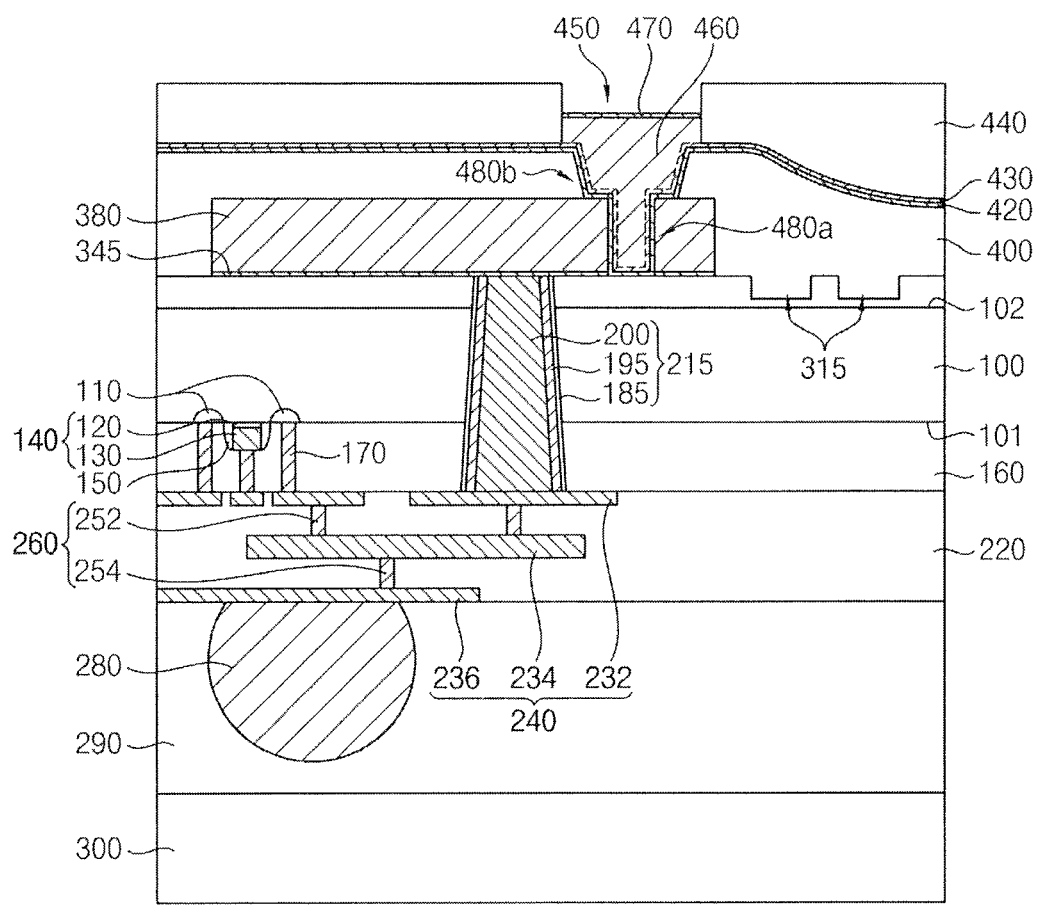

FIG. 21 shows a case in which the electroplating process illustrated with reference to FIG. 13 is performed until the third conductive layer 460 and the first capping layer 470 fill a lower portion of the fifth opening 450, when the fifth opening 450 of the fourth photoresist pattern 440 overlaps the fourth opening 410 and has an area greater than that of the fourth opening 410, in a plan view.

Figure 22:
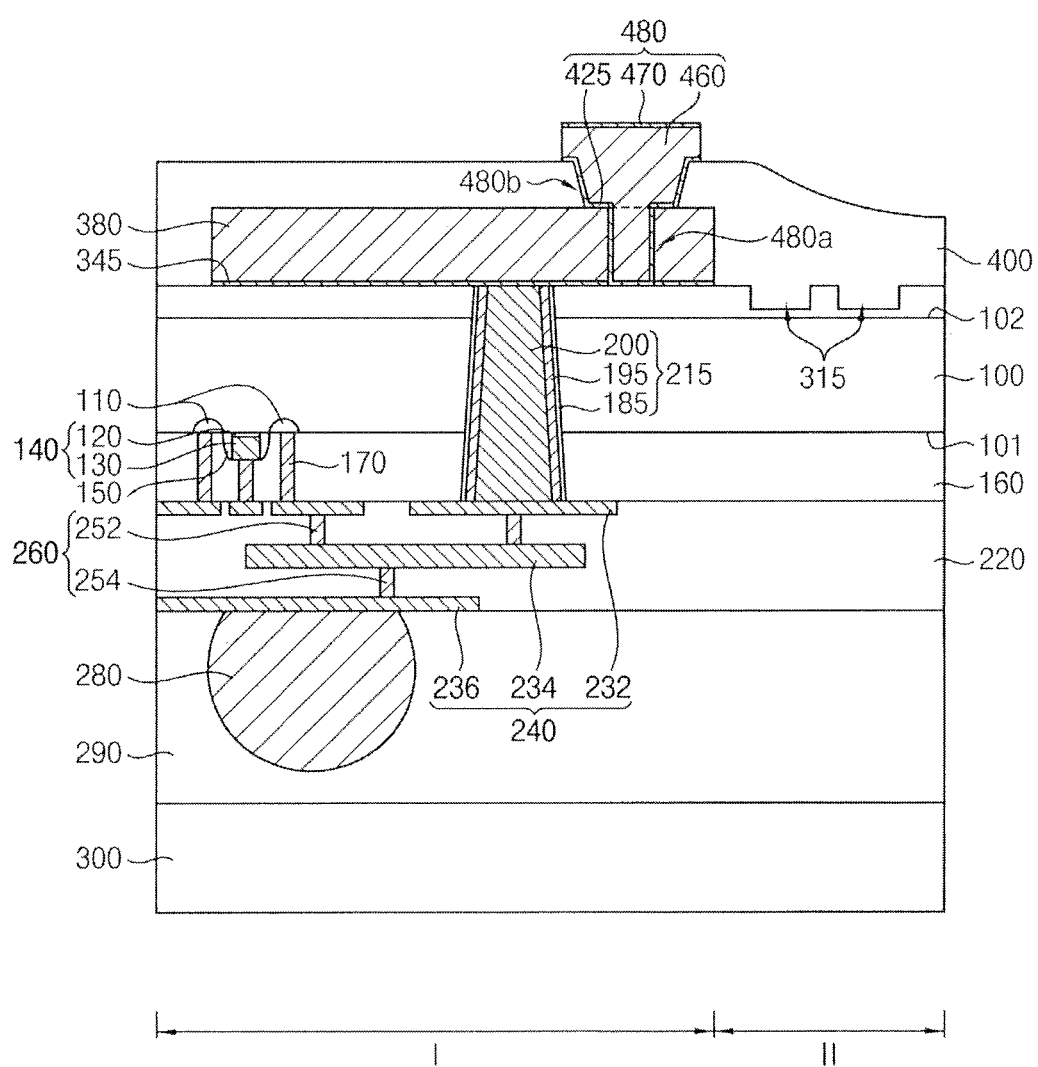

Referring to FIG. 22, the entire upper surface of the first conductive pad 480 may be substantially flat, however, the sidewall of the third conductive layer 460 of the first conductive pad 480 may be partially exposed.

Hereinafter, only the case illustrated with reference to FIGS. 13 and 14 will be described.

Referring to FIGS. 1A and 1B again, a first non-conductive layer 490 may be formed on the first protection layer 400 of the first semiconductor chip and the first conductive pad 480, a second semiconductor chip 500 may be bonded onto the first semiconductor chip through the first non-conductive layer 490, and the handling substrate 300 and the adhesion layer 290 may be divided or removed from the first semiconductor chip.

The second semiconductor chip 500 may include a fourth wiring 510 therein, and a second conductive pad 520 and a second conductive bump 530 may be sequentially formed on the second semiconductor chip 500. Thus, the second semiconductor chip 500 may be electrically connected to the first semiconductor chip through the second conductive pad 520 and the second conductive bump 530.

In an implementation, the first semiconductor chip and the second semiconductor chip 500 may be bonded with each other by a thermal compression non-conductive paste (TC-NCP) method. For example, the second conductive pad 520 of the second semiconductor chip 500 may be compressed toward the first conductive pad 480 of the first semiconductor chip at a high temperature, so that the second conductive bump 530 may adhere to the first conductive pad 480. Additionally, the first non-conductive layer 490 may fill a space between the first semiconductor chip and the second semiconductor chip 500, and thus the first semiconductor chip and the second semiconductor chip 500 may be attached to each other.

In the bonding process, the first non-conductive layer 490 having fluidity may be squeezed out outside of the second conductive bump 530. As noted above, at least the central upper surface of the first conductive pad 480 may be substantially flat, and thus the first non-conductive layer 490 may not remain on the first conductive pad 480. Thus, no foreign materials may remain between the first conductive pad 480 and the second conductive bump 530, so that the contact resistance between the first conductive pad 480 and the second conductive bump 530 may not decrease and the reliability of the semiconductor device may be enhanced.

Hereinafter a case in which a plurality of redistribution layers and a plurality of conductive pads are formed will be described with reference to FIG. 2.

When a plurality of redistribution layers is formed (refer to FIGS. 10 and 11), there may be a thickness distribution of or difference between the plurality of redistribution layers, and the protection layer (refer to FIG. 12) may also have a thickness distribution on the plurality of redistribution layers.

FIG. 2 shows the second and third redistribution layers having the first and second thicknesses T1 and T2, respectively, and the second and third protection layers 402 and 404 having the third and fourth thicknesses T3 and T4, respectively, and the upper surfaces having first and second heights H1 and H2, respectively. The second and third redistribution layers may include the fourth and fifth conductive layers 382 and 384, respectively, having different thicknesses from each other.

When the electroplating process illustrated with reference to FIG. 13 is performed, the electroplating process may be performed from the flat upper surface of the passivation layer 310, and thus the third and fourth conductive pads 482 and 484 may have substantially the same thickness, regardless of the thicknesses of the second and third redistribution layers or the thicknesses or heights of the second and third protection layers 402 and 404. Accordingly, the upper surfaces of the third and fourth conductive pads 482 and 484 may have substantially the same height, i.e., the third height H3.

For example, a plurality of conductive pads may have a uniform thickness, regardless of the thickness distribution of the redistribution layer, the thickness distribution of the protection layer, or the height distribution of the protection layer.

Figure 23:
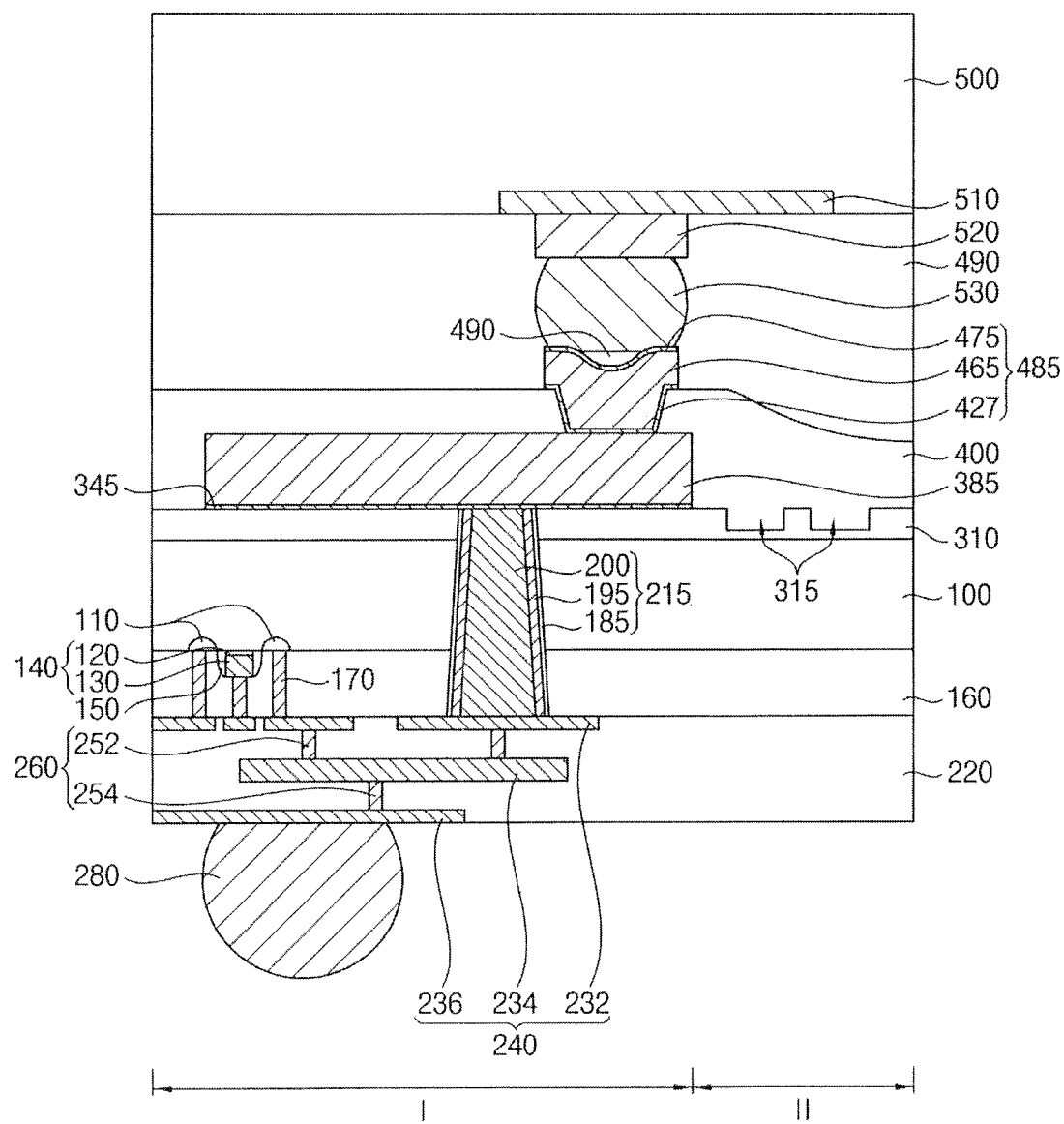
FIG. 23 illustrates a cross-sectional view of a semiconductor device in accordance with the Comparative Example.

FIG. 23 illustrates a cross-sectional view of a semiconductor device in accordance with a Comparative Example. This semiconductor device may be substantially the same as that of FIGS. 1A and 1B, except for the first conductive pad. Thus, like reference numerals refer to like elements, and detailed descriptions thereon are omitted herein.

Referring to FIG. 23, a first semiconductor chip of the semiconductor device may include a fifth conductive pad 485 on a fourth redistribution layer, and may be bonded with the second semiconductor chip 500 by the first non-conductive layer 490. The first semiconductor chip and the second semiconductor chip 500 may be electrically connected to each other through the fifth conductive pad 485 and the second conductive bump 530.

The fourth redistribution layer may include a sequentially stacked second barrier pattern 345 and sixth conductive layer 385.

The fifth conductive pad 485 may include a seventh conductive layer 465, a second capping layer 475, and a fourth barrier pattern 427, and a central upper surface of the fifth conductive pad 485 may be concave so as to be lower (e.g., closer to the substrate 100) than an edge upper surface thereof. Accordingly, when the second conductive bump 530 is compressed onto the fifth conductive pad 485, a portion of the first non-conductive layer 490 may remain between the second conductive bump 530 and the fifth conductive pad 485, which may increase the contact resistance therebetween and deteriorate the reliability of the semiconductor device.

Additionally, an upper sidewall of the seventh conductive layer 465 of the fifth conductive pad 485 may be exposed so that the seventh conductive layer 465 may be weakened due to oxidation.

The fifth conductive pad 485 may be formed by an electroplating process from an upper surface of the fourth redistribution layer exposed by the fourth opening 410 (refer to FIG. 26) until it is formed on an upper surface of the first protection layer 400, and thus, if a plurality of fourth redistribution layers is formed, the fifth conductive pads 485 may not be formed to have a uniform thickness according to the thickness distribution of the fourth redistribution layers and/or the thickness distribution of the first protection layer 400. This will be explained in detail below.

FIGS. 24 to 28 illustrate cross-sectional views of stages in a method of manufacturing the semiconductor device of FIG. 23. This method may include processes substantially the same as or similar to those illustrated with reference to FIGS. 3 to 22, and thus detailed descriptions thereon may be omitted herein.

Processes substantially the same as or similar to those illustrated with reference to FIGS. 3 to 7 are performed.

Figure 24:
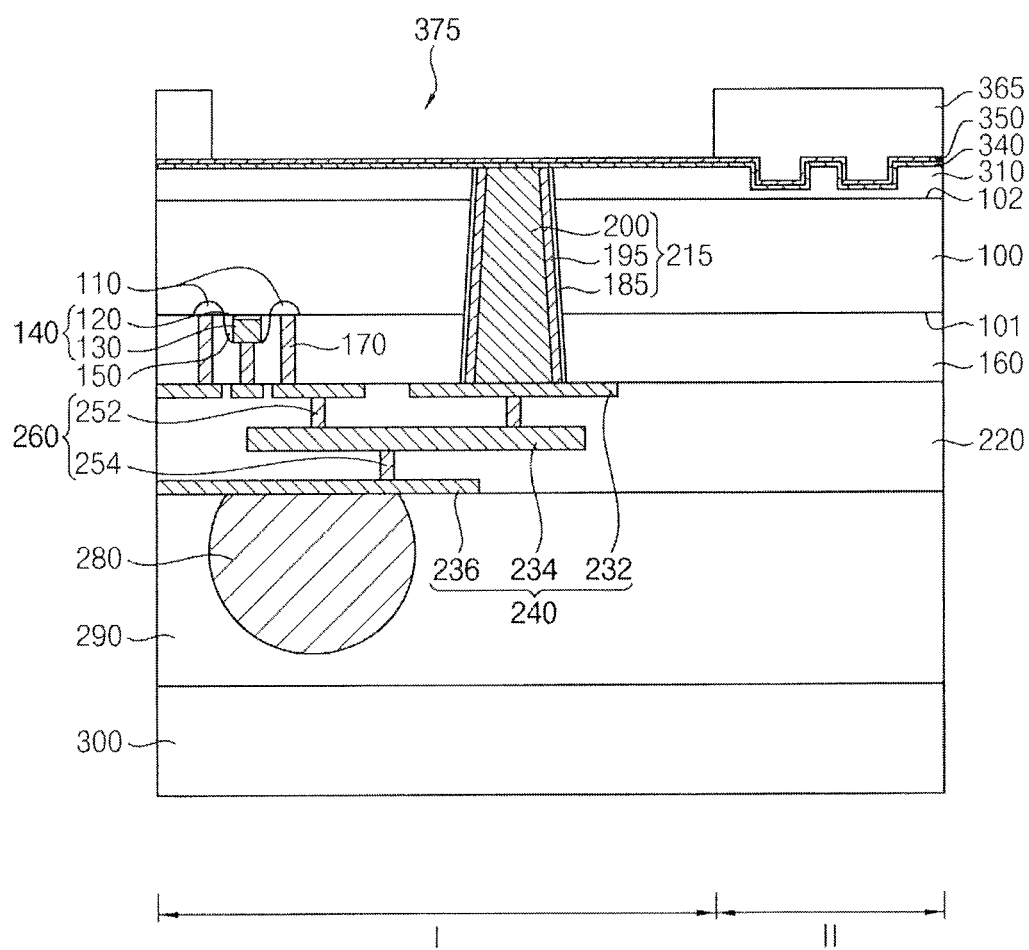
FIGS. 24 to 28 illustrate cross-sectional views of stages in a method of manufacturing the semiconductor device of FIG. 23.

Referring to FIG. 24, processes substantially the same as or similar to those illustrated with reference to FIG. 8 may be performed.

However, instead of the third photoresist pattern 360 including the second opening 370, a fifth photoresist pattern 365 including a sixth opening 375 may be formed. Unlike the second opening 370, the sixth opening 375 may not include a non-exposure portion therein.

Figure 25:
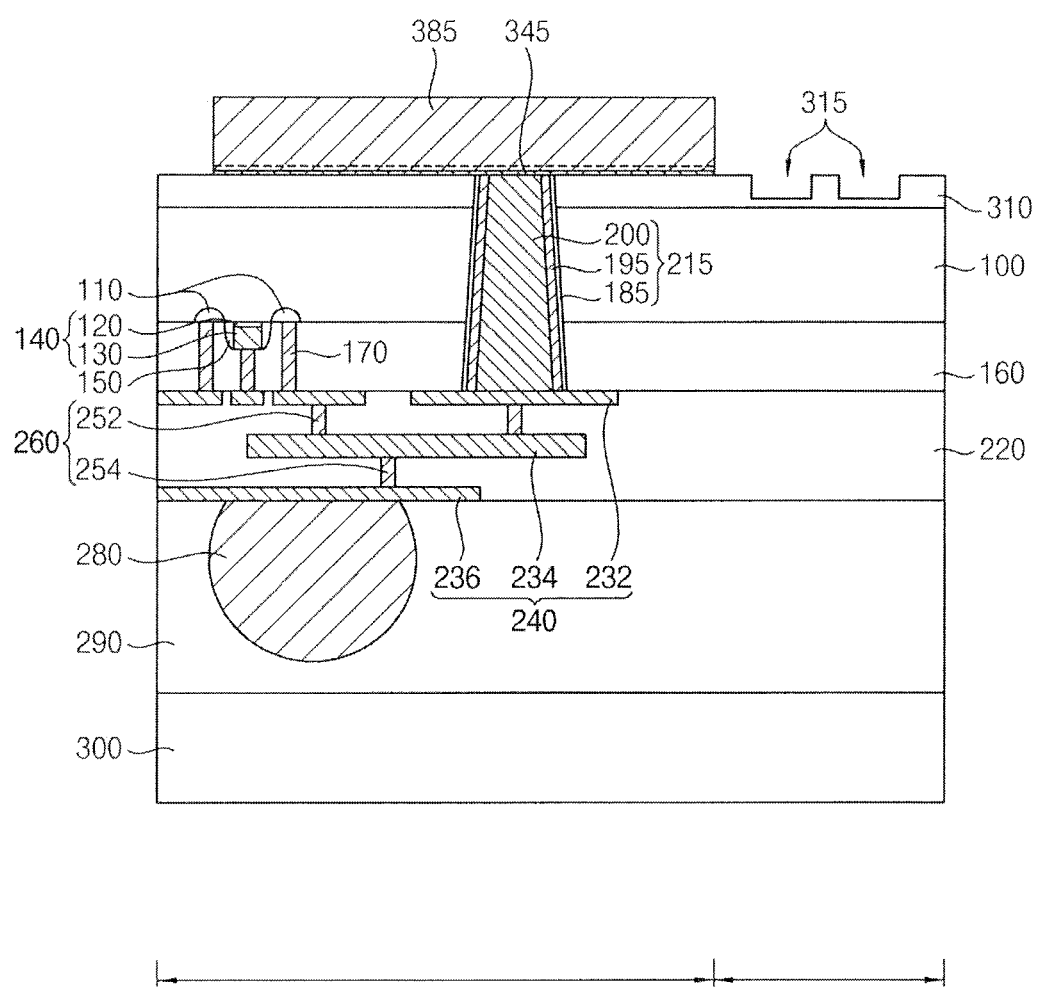

Referring to FIG. 25, processes substantially the same as or similar to those illustrated with reference to FIG. 10 may be performed.

Thus, a sixth conductive layer 385 may be formed to fill the sixth opening 375 by an electroplating process, and may form a fourth redistribution layer together with the second barrier pattern 345.

Figure 26:
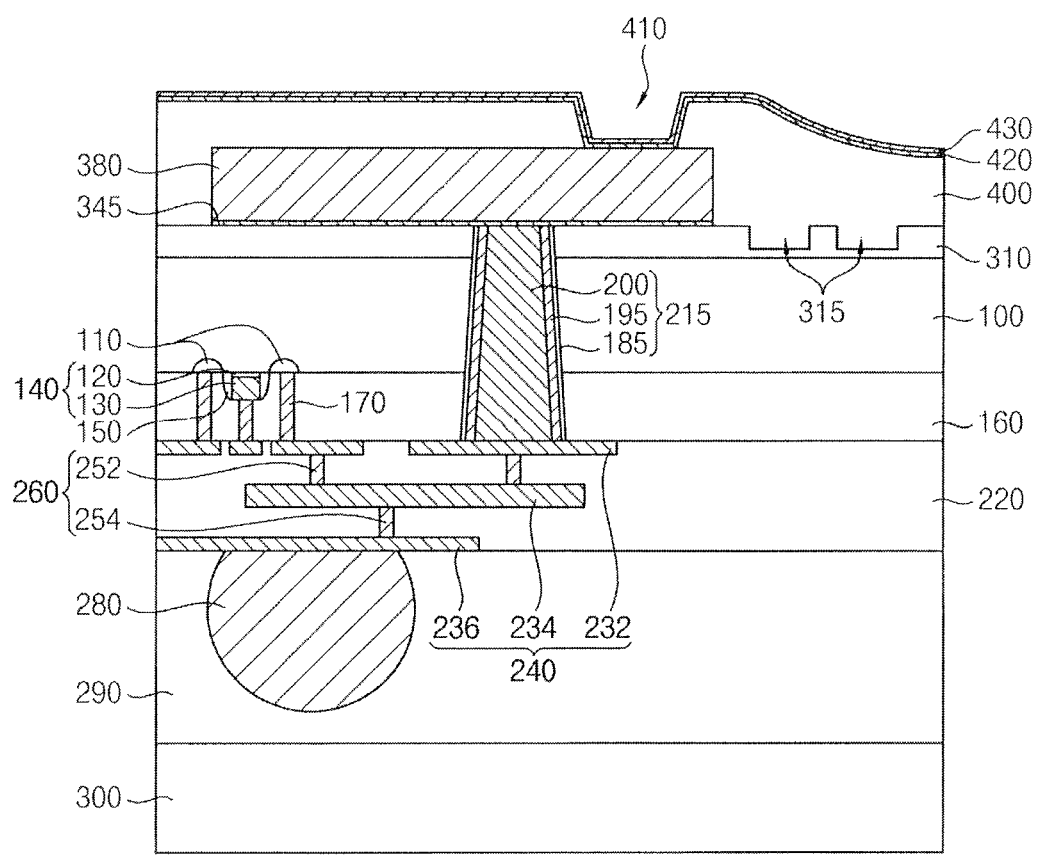

Referring to FIG. 26, processes substantially the same as or similar to those illustrated with reference to FIG. 12 may be performed to form the first protection layer 400 on the passivation layer 310 to cover the fourth redistribution layer.

In an implementation, the first protection layer 400 may include the fourth opening 410 exposing an upper surface of the sixth conductive layer 385 of the fourth redistribution layer.

The third barrier layer 420 and the second seed layer 430 may be sequentially formed on the exposed upper surface of the sixth conductive layer 385, the sidewall of the fourth opening 410, and the upper surface of the first protection layer 400.

Figure 27:
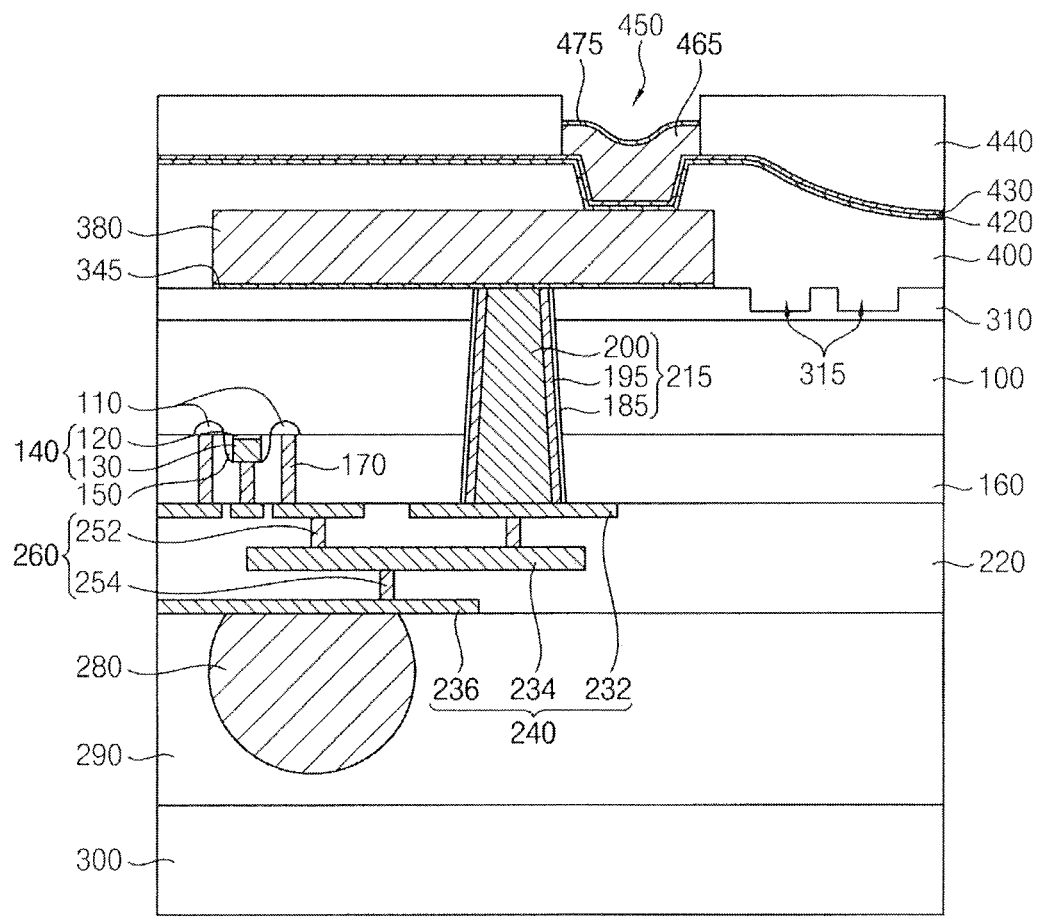

Referring to FIG. 27, the fourth photoresist pattern 440 including the fifth opening 450 connected to the fourth opening 410 may be formed on the second seed layer 430, and an electroplating process may be performed using an exposed portion of the second seed layer.

The fifth opening 450 may overlap the fourth opening 410 and may have an area greater than that of the fourth opening 410 in a plan view, and the seventh conductive layer 465 and the second capping layer 475 may be formed to fill the fourth opening 410 and a lower portion of the fifth opening 450.

The electroplating process may be performed from the upper surface of the first protection layer 400 exposed by the bottom and the sidewall of the fourth opening 410 and the fifth opening 450, and a central upper surface of each of the seventh conductive layer 465 and the second capping layer 475 may be concave according to the depth of the fourth opening 410. For example, the central upper surface of each of the seventh conductive layer 465 and the second capping layer 475 may be lower than an edge upper surface thereof.

Figure 28:
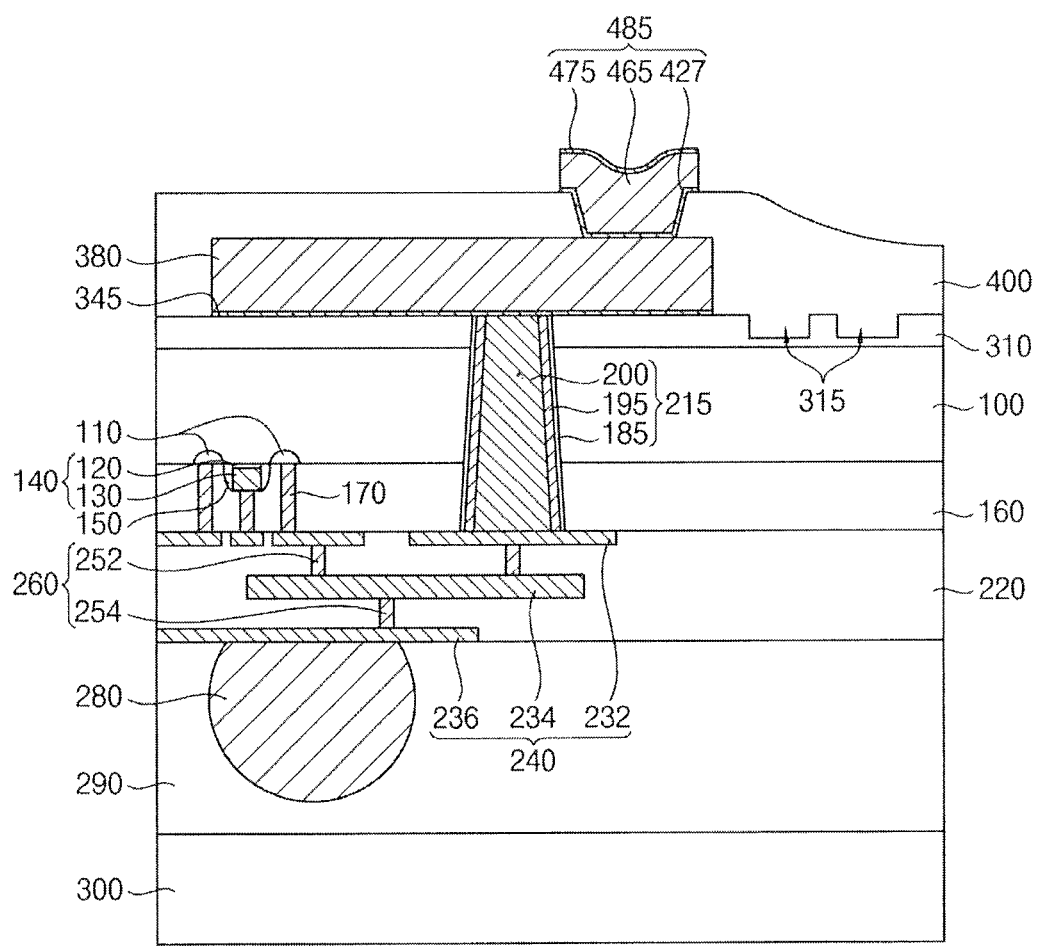
Figure 29A:
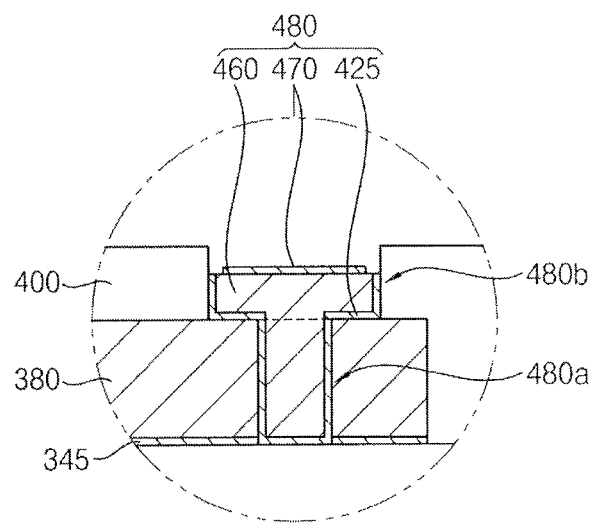
FIGS. 29A, 29B, 29C and 29D illustrate cross-sectional views of shapes of the first conductive pads in the first semiconductor chip of the semiconductor device in accordance with example embodiments.
Figure 29B:
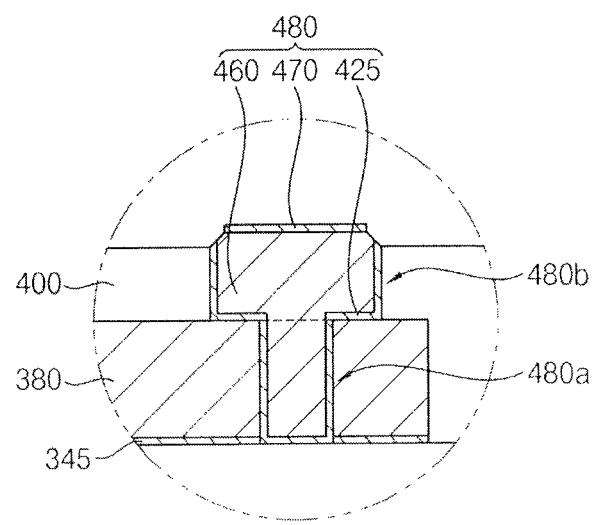
Figure 29C:
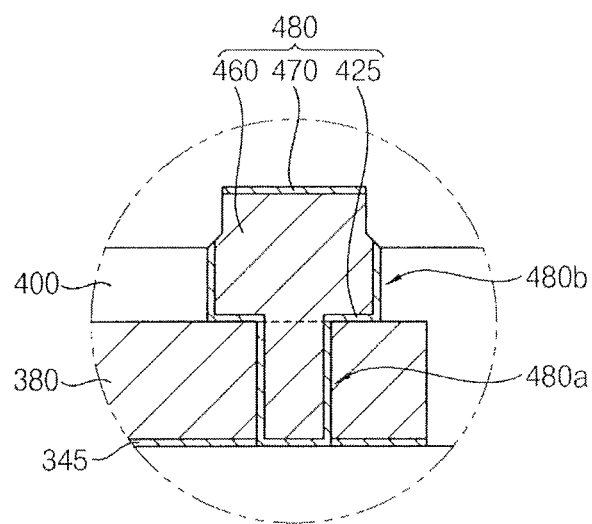
Figure 29D:
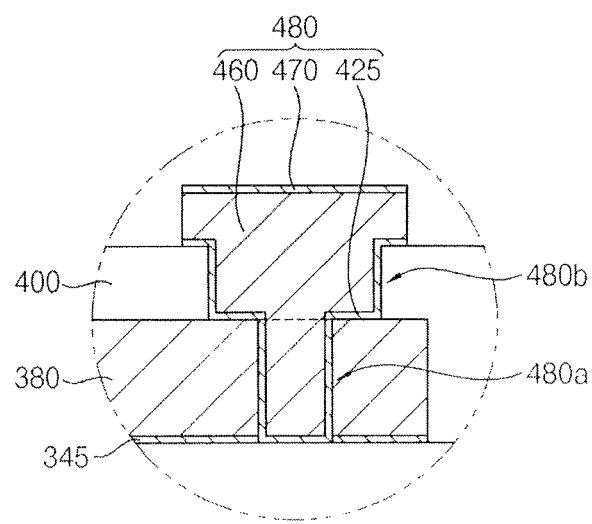

Referring to FIG. 28, processes substantially the same as or similar to those illustrated with reference to FIG. 14 may be performed to remove the fourth photoresist pattern 440 and an exposed portion of the second seed layer 430 and a portion of the third barrier layer 420 thereunder. Accordingly, the third barrier layer 420 may be transformed into the fourth barrier pattern 427.

A fifth conductive pad 485 including the seventh conductive layer 465, the second capping layer 475, and the fourth barrier pattern 427 may be formed on the fourth redistribution layer, and a central upper surface of the fifth conductive pad 485 may be lower than an edge upper surface thereof. Additionally, an upper sidewall of the seventh conductive layer 465 of the fifth conductive pad 485 may be exposed to be weak to oxidation.

The electroplating process may be performed from the upper surface of the fourth redistribution layer exposed by the fourth opening 410 until it may be formed on the upper surface of the first protection layer 400, and thus, if a plurality of fourth redistribution layers is formed, the fifth conductive pads 485 may not be formed to have a uniform thickness according to the thickness distribution of the fourth redistribution layers and/or the thickness distribution of the first protection layer 400.

Referring to FIG. 23 again, processes substantially the same as or similar to those illustrated with reference to FIGS. 1A and 1B may be performed to complete the fabrication of the semiconductor device.

The central upper surface of the fifth conductive pad 485 may be concave and lower than the edge upper surface thereof, and thus, when the second conductive bump 530 is compressed onto the fifth conductive pad 485, a portion of the first non-conductive layer 490 may remain therebetween. Accordingly, the contact resistance between the second conductive bump 530 and the fifth conductive pad 485 may increase, and the reliability of the semiconductor device may be deteriorated.

FIGS. 29A, 29B, 29C and 29D illustrate cross-sectional views of shapes of the first conductive pads in the first semiconductor chip of the semiconductor device in accordance with example embodiments.

In an implementation, referring to FIGS. 29A, 29B, 29C and 29D, at least a lower sidewall of the protrusion portion 480b of each of the first conductive pads 480 may be substantially perpendicular to the upper surface of the substrate 100. When the electroplating process illustrated with reference to FIGS. 13 and 14 is performed, the fourth opening 410 of the first protection layer 400 may have a sidewall perpendicular to the upper surface of the substrate 100, and thus the protrusion portion 480b of each of the first conductive pads 480 may have a sidewall substantially perpendicular to the upper surface of the substrate 100.

Figure 30:
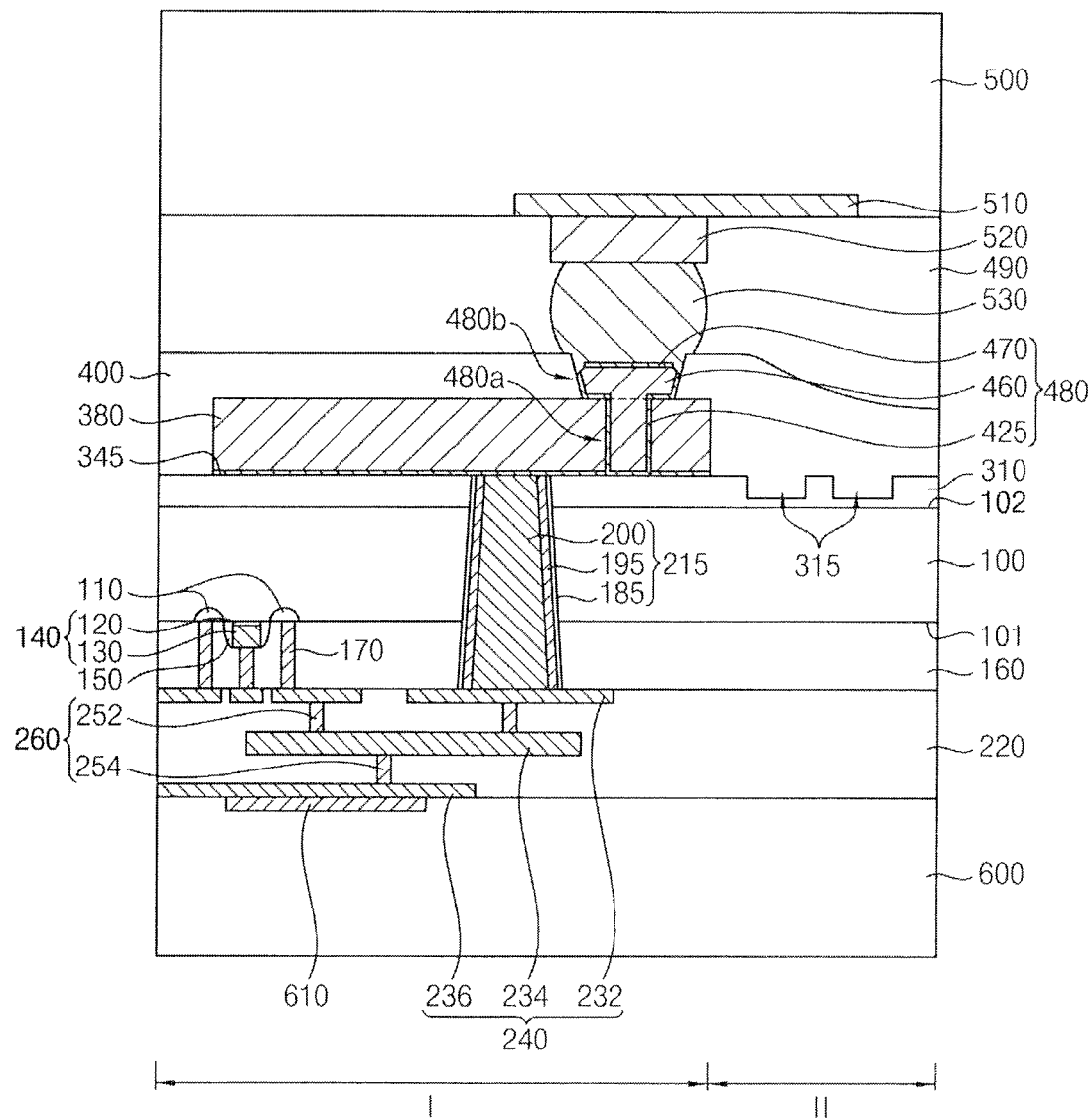
FIG. 30 illustrates a cross-sectional view of a semiconductor package in accordance with example embodiments.

FIG. 30 illustrates a cross-sectional view of a semiconductor package in accordance with example embodiments. This semiconductor package may be a CMOS image sensor (CIS) package including the semiconductor device illustrated with reference to FIGS. 1A and 1B.

Referring to FIG. 30, the CIS package may include a third semiconductor chip 600, the first semiconductor chip, and the second semiconductor chip 500 sequentially stacked, and the first semiconductor chip and the second semiconductor chip 500 may be bonded with each other as shown in FIGS. 1A and 1B, and may be electrically connected to each other through the first and second conductive pads 480 and 520 and the second conductive bump 530.

Unlike that of FIGS. 1A and 1B, no first conductive bump 280 may be formed under the first semiconductor chip, and the third semiconductor chip 600 and the first semiconductor chip may be bonded with each other by a wafer to wafer bonding method. Accordingly, the third wiring 236 in the first semiconductor chip and a fifth wiring 610 in the third semiconductor chip 600 may be connected to each other, and insulation layers of the first semiconductor chip and the third semiconductor chip 600 may be attached to each other.

In an implementation, the third semiconductor chip 600 may include a CIS chip, the first semiconductor chip may include a logic chip, and the second semiconductor chip 500 may include a memory chip, e.g., a DRAM chip.

Figure 31:
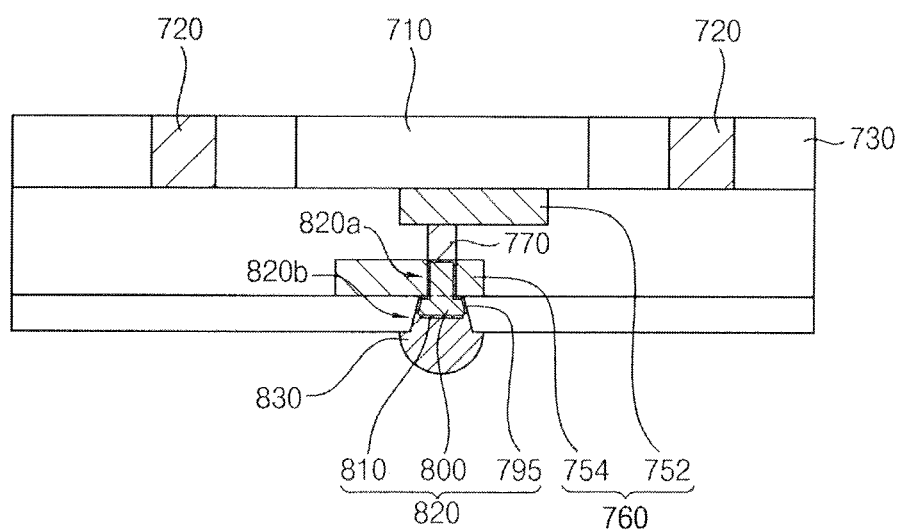
FIG. 31 illustrates a cross-sectional view of a semiconductor package in accordance with example embodiments.

FIG. 31 illustrates a cross-sectional view of a semiconductor package in accordance with example embodiments. This semiconductor package may be an integrated fan out (INFO) package including the semiconductor device illustrated with reference to FIGS. 1A and 1B.

Referring to FIG. 30, the INFO package may include a fourth protection layer 780, a third insulating interlayer 740, and a fourth semiconductor chip 710 sequentially stacked.

Redistribution layers 760 and a third via 770 may be formed in the third insulating interlayer 740. In the figure, the redistribution layers 760 include sixth and fifth redistribution layers 754 and 752 sequentially stacked, however, the inventive concepts may not be limited thereto.

A sixth conductive pad 820 including a penetrating portion 820a extending through the sixth redistribution layer 754 and a protrusion portion 820b protruding downwardly from a lower surface of the sixth redistribution layer 754 may be formed, and a sidewall of the protrusion portion 820b of the sixth conductive pad 820 may be covered by the fourth protection layer 780. The sixth conductive pad 820 may include an eighth conductive layer 800, a third capping layer 810, and a fifth barrier pattern 795.

The semiconductor package may further include a fourth conductive bump 830 attached onto a lower surface of the sixth conductive pad 820, and third conductive bumps 720 spaced apart from the fourth semiconductor chips 710 on the third insulating interlayer 740. Sidewalls of the fourth semiconductor chips 710 and the third conductive bumps 720 may be covered by a molding element 730, e.g., epoxy molding compound (EMC).

In an implementation, each of the fourth semiconductor chips 710 may include a logic chip or a memory chip.

The semiconductor package may serve as a printed circuit board (PCB).

Figure 32:
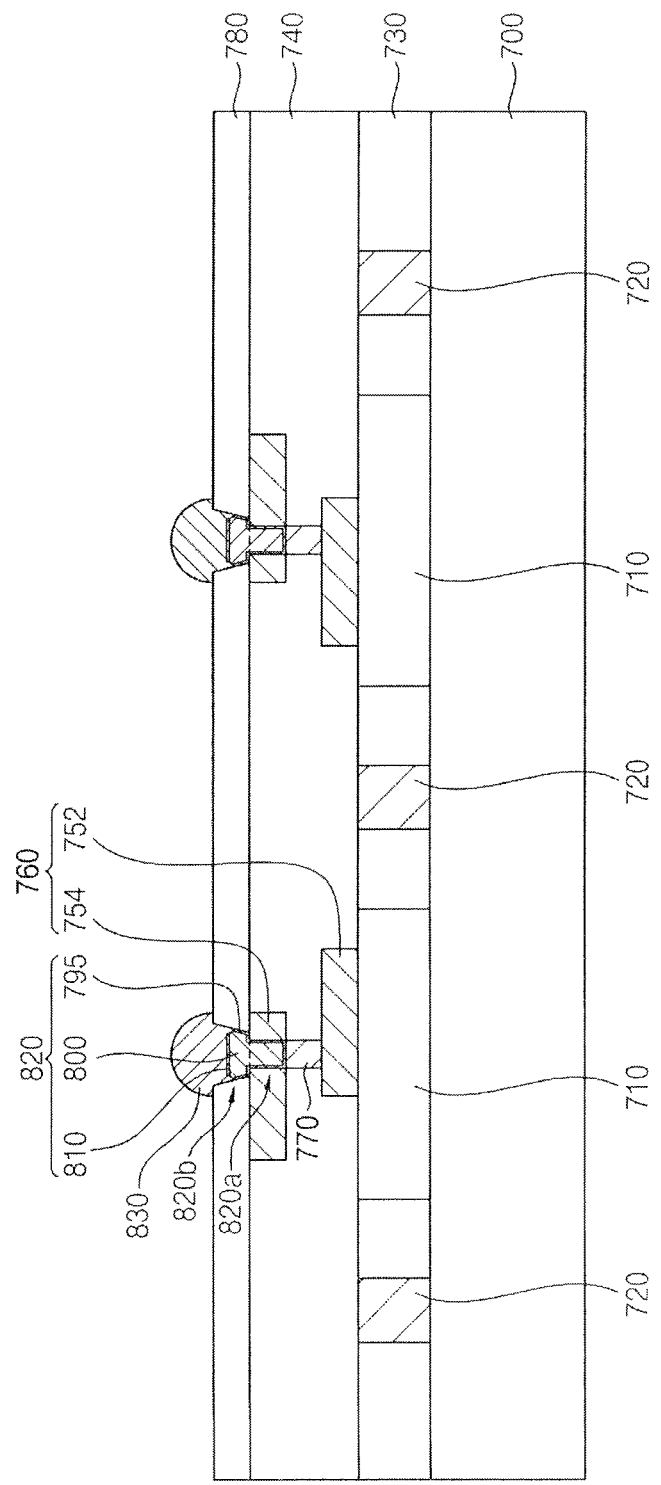
FIG. 32 illustrates a cross-sectional view of a stage in a method of manufacturing the semiconductor package of FIG. 31.

FIG. 32 illustrates a cross-sectional view of stages in a method of manufacturing the semiconductor package of FIG. 31.

Referring to FIG. 32, fourth semiconductor chips 710 and third conductive bumps 720 may be mounted on a wafer 700, and an upper structure may be attached to the wafer 700 using a molding element 730.

The upper structure may include a third insulating interlayer 740 containing redistribution layers 760 and a third via 770 connecting the redistribution layers 760, a sixth conductive pad 820 extending through one of the redistribution layers 760, a fourth protection layer 780 surrounding an upper sidewall of the sixth conductive pad 820, and a fourth conductive bump 830 attached to an upper surface of the sixth conductive pad 820.

Referring to FIG. 31 again, after rotating the wafer 700 by 180 degrees, the wafer 700 may be sawn to include one or a plurality of fourth semiconductor chips 710 and the third conductive bump 720, so that the semiconductor package may be manufactured.

Figure 33:
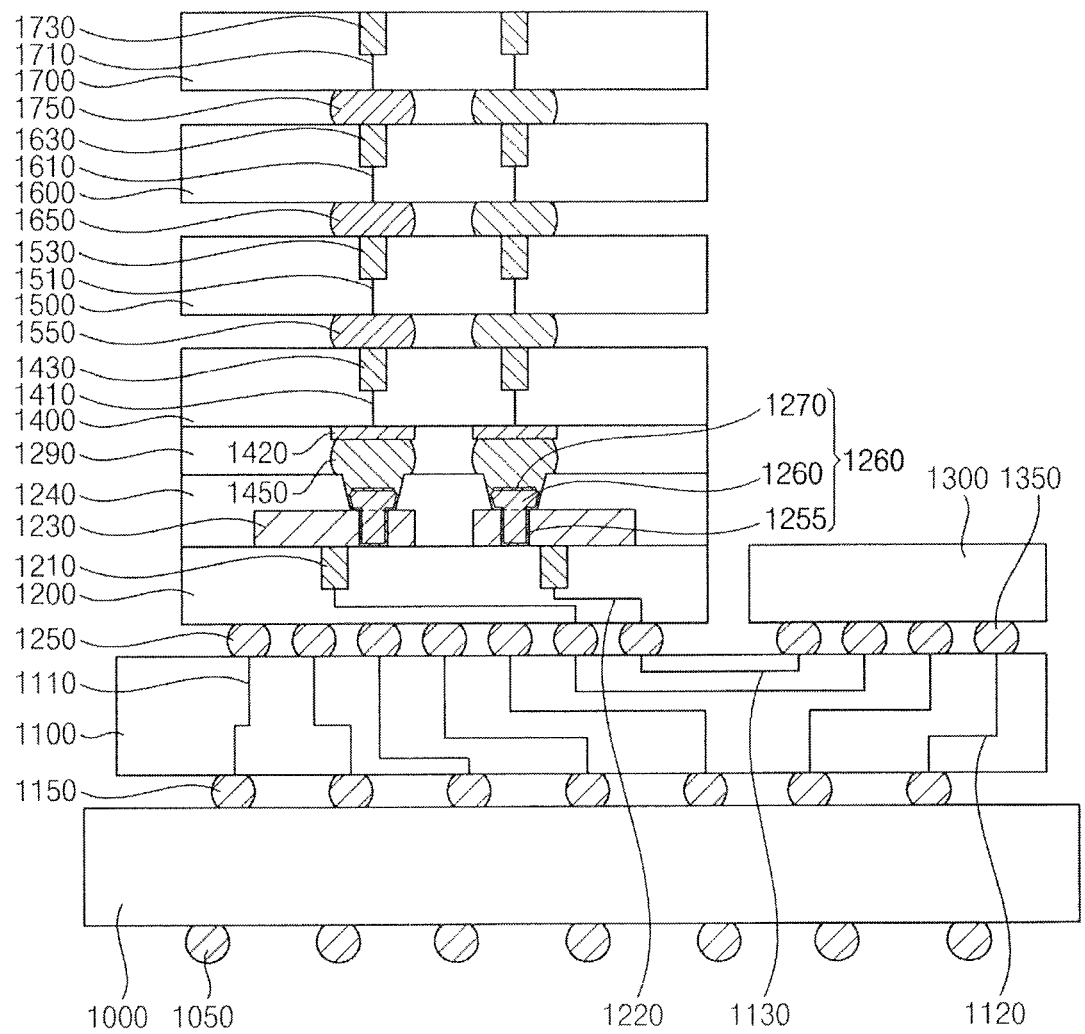
FIG. 33 illustrates a cross-sectional view of a semiconductor package in accordance with example embodiments.

FIG. 33 illustrates a cross-sectional view of a semiconductor package in accordance with example embodiments. This semiconductor package may be a high bandwidth memory (HBM) package including the semiconductor device illustrated with reference to FIGS. 1A and 1B.

Referring to FIG. 33, the semiconductor package may include a package substrate 1000, an interposer 1100, a logic chip 1200, and memory chips. The semiconductor package may further include a GPU chip 1300 spaced apart from the logic chip 1200 on the interposer 1100. In the figure, four memory chips. i.e., first to fourth memory chips 1400, 1500, 1600 and 1700 are shown, however, the inventive concepts may not be limited thereto.

The package substrate 1000 may include. e.g., a PCB. An outer connection terminal 1050 may be formed beneath the package substrate 1000, and thus the semiconductor package may be mounted on a module substrate through the outer connection terminal 1050.

Fifth conductive bumps 1150 may be formed between the package substrate 1000 and the interposer 1100, sixth conductive bumps 1250 may be formed between the interposer 1100 and the logic chip 1200, seventh conductive bumps 1350 may be formed between the interposer 1100 and the GPU chip 1300, eighth conductive bumps 1450 may be formed between the logic chip 1200 and the first memory chip 1400, ninth conductive bumps 1550 may be formed between the first memory chip 1400 and the second memory chip 1500, tenth conductive bumps 1650 may be formed between the second memory chip 1500 and the third memory chip 1600, and eleventh conductive bumps 1650 may be formed between the third memory chip 1600 and the fourth memory chip 1700.

Sixth to eighth wirings 1110, 1120 and 1230 may be formed in the interposer 1100. The sixth wiring 1110 may electrically connect ones of the fifth conductive bumps 1150 to ones of the sixth conductive bumps 1250, the seventh wiring 1120 may electrically connect ones of the fifth conductive bumps 1150 to ones of the seventh conductive bumps 1350, and the eighth wiring 1130 may electrically connect ones of the sixth conductive bumps 1250 to ones of the seventh conductive bumps 1350.

The logic chip 1200 may include a second through-hole electrode structure 1210, a ninth wiring 1220, a seventh redistribution layer 1230, a seventh conductive pad 1280, and a fifth protection layer 1240.

The ninth wiring 1220 may electrically connect ones of the sixth conductive bumps 1250 to the second through-hole electrode structure 1210, the seventh redistribution layer 1230 may be electrically connected to the second through-hole electrode structure 1210, the seventh conductive pad 1280 may extend through the seventh redistribution layer 1230 to protrude upwardly, and the fifth protection layer 1240 may surround an upper sidewall of the seventh conductive pad 1280. The seventh conductive pad 1280 may include a ninth conductive layer 1260, a fourth capping layer 1270, and a sixth barrier pattern 1255.

The first memory chip 1400 may include a third through-hole electrode structure 1430, a tenth wiring 1410, and an eighth conductive pad 1420 that may be electrically connected to each other, and may be electrically connected to the seventh conductive pad 1280 through the eighth conductive bump 1450. Additionally, the logic chip 1200 and the first memory chip 1400 may be bonded with each other by a second non-conductive layer 1290.

The second to fourth memory chips 1500, 1600 and 1700 may include fourth to sixth through-hole electrode structures 1530, 1630 and 1730, respectively, and eleventh to thirteenth wirings 1510, 1610 and 1710, respectively.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, if foreign substances were to be interposed between a conductive bump and a conductive pad, adhesion failure could occur, and the reliability of the semiconductor package could be deteriorated.

The embodiments may provide a semiconductor device including a redistribution layer.

The embodiments may provide a semiconductor device having a high reliability.

The embodiments may provide a semiconductor package having a high reliability.

The embodiments may provide a method of manufacturing a semiconductor device having a high reliability.

In the semiconductor device in accordance with example embodiments, foreign substances may not remain between the conductive bump electrically connect upper and lower semiconductor chips to each other and the lower semiconductor chip, and thus contact resistance between the conductive bump and the lower semiconductor chip may decrease and the reliability of the semiconductor device may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a through-hole electrode structure extending through a substrate;
   a redistribution layer on the through-hole electrode structure; and
   a conductive pad, the conductive pad including:
      a penetrating portion extending through the redistribution layer; and
      a protrusion portion on the penetrating portion, the protrusion portion protruding from an upper surface of the redistribution layer, wherein a central region of an upper surface of the protrusion portion is flat and not closer to the substrate than an edge region of the upper surface of the protrusion portion.

2. The semiconductor device as claimed in claim 1, wherein the protrusion portion of the conductive pad has a sidewall that is slanted with respect to an upper surface of the substrate.

3. The semiconductor device as claimed in claim 2, wherein the edge region of the upper surface of the protrusion portion of the conductive pad has a slope that is opposite to a slope of the sidewall of the protrusion portion.

4. The semiconductor device as claimed in claim 1, wherein the protrusion portion of the conductive pad has a sidewall that is perpendicular to an upper surface of the substrate.

5. The semiconductor device as claimed in claim 1, wherein the penetrating portion of the conductive pad has a sidewall that is perpendicular to an upper surface of the substrate.

6. The semiconductor device as claimed in claim 1, wherein the conductive pad includes:
   a conductive layer, and
   a barrier pattern covering a bottom and a sidewall of the conductive layer.

7. The semiconductor device as claimed in claim 6, wherein the conductive pad further includes a capping layer on an upper surface of the conductive layer.

8. The semiconductor device as claimed in claim 7, wherein the capping layer covers a central region of the upper surface of the conductive layer and does not cover an edge region of the upper surface of the conductive layer.

9. The semiconductor device as claimed in claim 1, further comprising a protection layer covering the redistribution layer and at least a portion of a sidewall of the protrusion portion of the conductive pad.

10. The semiconductor device as claimed in claim 9, wherein the protection layer does not cover an upper surface of the conductive pad.

11. The semiconductor device of claim 9, wherein the upper surface of the conductive pad is closer to the substrate than an upper surface of the protection layer.

12. The semiconductor device as claimed in claim 9, wherein the upper surface of the conductive pad is farther from the substrate than an upper surface of the protection layer.

13. A semiconductor device, comprising:
   a through-hole electrode structure extending through a substrate;
   redistribution layers on the through-hole electrode structure; and
   conductive pads, each of the conductive pads including:
      a penetrating portion extending through one of the redistribution layers; and
      a protrusion portion on the penetrating portion, the protrusion portion protruding from an upper surface of the one of the redistribution layers,
   wherein at least two of the redistribution layers have different thicknesses from each other, and
   wherein upper surfaces of the redistribution layers have the same height from the substrate.

14. The semiconductor device as claimed in claim 13, wherein:
- the at least two of the redistribution layers are first and second redistribution layers, respectively, and
- the first redistribution layer has a thickness that is greater than a thickness of the second redistribution layer.

15. The semiconductor device as claimed in claim 14, wherein:
- a first penetrating portion of a first conductive pad extending through the first redistribution layer has a thickness that is greater than a thickness of a second penetrating portion of a second conductive pad extending through the second redistribution layer, and
- a first protrusion portion of the first conductive pad has a thickness that is less than a thickness of a second protrusion portion of the second conductive pad.

16. The semiconductor device as claimed in claim 14, further comprising a protection layer covering the redistribution layers and at least a portion of a sidewall of the protrusion portion of each of the conductive pads.

17. The semiconductor device as claimed in claim 16, wherein an upper surface of the protection layer does not have a uniform height.

18. The semiconductor device as claimed in claim 17, wherein an upper surface of a first portion of the protection layer covering the first redistribution layer is farther from the substrate than an upper surface of a second portion of the protection layer covering the second redistribution layer.

19. The semiconductor device as claimed in claim 13, wherein a central region of an upper surface of the protrusion portion of each of the conductive pads is not closer to the substrate than an edge region of the upper surface of the protrusion portion.

20. A semiconductor device, comprising:
- a first semiconductor chip, the first semiconductor chip including a through-hole electrode structure extending through a substrate, a redistribution layer on the through-hole electrode structure, and a first conductive pad, the first conductive pad including:
  - a penetrating portion extending through the redistribution layer; and
  - a protrusion portion on the penetrating portion, the protrusion portion protruding from an upper surface of the redistribution layer, and a central region of an upper surface of the protrusion portion being flat and not closer to the substrate than an edge region of the upper surface of the protrusion portion; and
- a second semiconductor chip on one side of the first semiconductor chip, the second semiconductor chip being electrically connected to the first semiconductor chip through the first conductive pad.

* * * * *